United States Patent
Yamaoka et al.

(10) Patent No.: US 8,330,496 B2
(45) Date of Patent: Dec. 11, 2012

(54) SEMICONDUCTOR INTEGRATED CIRCUIT DEVICE

(75) Inventors: Masanao Yamaoka, Kodaira (JP); Takayuki Kawahara, Higashiyamato (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 12/620,903

(22) Filed: Nov. 18, 2009

(65) Prior Publication Data

US 2010/0061169 A1   Mar. 11, 2010

Related U.S. Application Data

(63) Continuation of application No. 11/567,774, filed on Dec. 7, 2006, now Pat. No. 7,633,315.

(30) Foreign Application Priority Data

Dec. 20, 2005  (JP) ................................ 2005-366784

(51) Int. Cl.
*H03K 19/20* (2006.01)
*H03K 19/094* (2006.01)
(52) U.S. Cl. .......... 326/113; 326/40; 327/199; 327/215; 365/203; 365/229
(58) Field of Classification Search .............. 327/77, 327/87, 198–199, 215, 217, 530, 538, 540, 327/541, 543–545, 546; 365/203, 222, 229; 326/40, 112–113
See application file for complete search history.

(56) References Cited

U.S. PATENT DOCUMENTS

| | | | | |
|---|---|---|---|---|
| 5,477,498 A | * | 12/1995 | Ooishi | 365/208 |
| 5,703,392 A | * | 12/1997 | Guo | 257/392 |
| 5,781,062 A | | 7/1998 | Mashiko et al. | |
| 5,946,251 A | * | 8/1999 | Sato et al. | 365/203 |
| 5,986,924 A | * | 11/1999 | Yamada | 365/154 |
| 6,614,124 B1 | * | 9/2003 | Brown et al. | 365/226 |
| 6,826,074 B2 | * | 11/2004 | Yamauchi | 365/154 |
| 7,177,177 B2 | * | 2/2007 | Chuang et al. | 365/154 |
| 7,282,959 B2 | | 10/2007 | Sekigawa et al. | |
| 7,633,315 B2 | * | 12/2009 | Yamaoka et al. | 326/112 |
| 2004/0125681 A1 | * | 7/2004 | Yamaoka et al. | 365/229 |
| 2005/0276094 A1 | * | 12/2005 | Yamaoka et al. | 365/154 |
| 2006/0227595 A1 | * | 10/2006 | Chuang et al. | 365/154 |
| 2006/0274569 A1 | * | 12/2006 | Joshi et al. | 365/154 |

OTHER PUBLICATIONS

"90 nm Low Leakage SoC Design Techniques for Wireless Applications", 2005 IEEE International Solid-State Circuits Conference (ISSCC), 2005, p. 138-139.

* cited by examiner

*Primary Examiner* — Jason M Crawford
(74) *Attorney, Agent, or Firm* — Miles & Stockbridge P.C.

(57) ABSTRACT

An object of the present invention is to provide a technique of reducing the leakage current of a drive circuit for driving a circuit that must retain a potential (or information) when in its standby state.
A semiconductor integrated circuit device of the present invention includes a drive circuit for driving a circuit block. This drive circuit is made up of a double gate transistor with gates having different gate oxide film thicknesses. When the circuit block is in its standby state, the gate of the double gate transistor having a thinner gate oxide film is turned off and that having a thicker gate oxide film is turned on. This arrangement allows a reduction in the leakage currents of both the circuit block and the drive circuit while allowing the drive circuit to deliver or cut off power to the circuit block.

3 Claims, 39 Drawing Sheets

SEMICONDUCTOR INTEGRATED CIRCUIT DEVICE

CROSS-REFERENCE TO RELATED APPLICATION

The present application is a continuation of application Ser. No. 11/567,774 filed Dec. 7, 2006 now U.S. Pat. No. 7,633,315. This application also claims priority from Japanese application JP 2005-366784, filed on Dec. 20, 2005, the content of which is hereby incorporated by reference into this application.

BACKGROUND OF THE INVENTION

1. Field of the Invention

The present invention relates to a semiconductor integrated circuit device in which a processing circuit is integrated on a semiconductor chip to perform specific processing on a received signal and output the processed signal, and more particularly to a technique of reducing the power consumption of such a semiconductor integrated circuit device.

2. Description of the Related Art

An exemplary conventional circuit for reducing the leakage current of a logic circuit includes an n-channel transistor and an inverter circuit. The n-channel transistor operates as a switch for cutting off power supply to the logic circuit, and the inverter circuit is used to drive the n-channel transistor. (See, for example, "90 nm Low Leakage SoC Design Technique for Wireless Applications", 2005 IEEE International Solid-State Circuits Conference (ISSCC), 2005, p. 138-139, FIGS. 7, 6, 3.)

SUMMARY OF THE INVENTION

The prevent inventors have studied the conventional technique disclosed in the above nonpatent document and have come up with a unique technique, as shown in FIG. 26, which has led to the present invention. Referring to FIG. 26, symbol Logic denotes an integrated circuit block including many circuits; Vssm, a ground potential line within the circuit block Logic; STBY, a standby signal, which is set at a high level when the circuit block Logic is in its standby state; PSW, a power switch used to cut off power supply to the circuit block Logic; SWON, a signal for controlling the power switch PSW; DRV, a drive circuit for generating the signal SWON (or driving the power switch PSW); and MN1, an nMOS transistor within the drive circuit DRV. When the circuit block Logic is not operating (that is, when it is in its standby state), the ground potential line Vssm of the circuit block Logic is disconnected from ground potential line Vss by the power switch PSW in order to reduce the leakage current of the circuit block Logic. As a result, the potential of the ground potential line Vssm rises, resulting in a reduction in the leakage current of the circuit block Logic. The above nonpatent document discloses an example of such circuitry, which includes: an n-channel transistor operating as a switch for cutting off power supply to a logic circuit; and an inverter circuit for driving the n-channel transistor.

However, the above circuitry is disadvantageous in that controlling the power switch PSW so as to cut off power supply to the circuit block Logic requires that the nMOS transistor MN1 in the circuit DRV for generating the signal SWON be turned on to set the voltage of the signal SWON to a low level. When the nMOS transistor is in an on state, a gate leakage current flows from the gate electrode to the source electrode. FIG. 27 shows the voltage (or potential) of each point in the circuitry, the leakage current (Ilogic) flowing through the circuit block Logic, and the gate leakage current (ISTBY) flowing through the nMOS transistor from the node STBY.

Incidentally, as the size of circuits on an LSI (Large Scale Integrated Circuit) chip has been increased, the leakage current flowing through these circuits when they are not operating has become a limiting factor in reducing the power consumption of the chip. A technique widely used to overcome this problem is to provide a power switch between the power supply and circuits on the LSI chip and turn off this power switch when the circuits are not operating so as to reduce their leakage current.

However, although it is possible to reduce the leakage current of these circuits connected to the power switch, it is not possible to cut off or reduce the current of the control circuit for controlling this power switch. As fine processing technology for semiconductor devices has advanced, the thickness of the gate oxide films (i.e., gate insulating films) of transistors has been reduced, resulting in an increase in the gate leakage current flowing through these films. Since an increase in the gate leakage current of the above control circuit (whose power cannot be cut off, as described above) means an increase in the leakage current of the entire circuitry, it is necessary to reduce this gate leakage current (of the control circuit) in order to reduce the leakage current of the entire LSI chip.

It is, therefore, an object of the present invention to reduce the leakage current of a control circuit provided to reduce the leakage current of an LSI circuit by use of a power switch.

To accomplish the above object, a semiconductor integrated circuit device of the present invention comprises: a power switch for cutting off power supply to a circuit block having a particular function; and a drive circuit for controlling the power switch, the drive circuit including a first transistor and a second transistor; wherein a drain electrode of the first transistor is electrically connected to a drain electrode of the second transistor; wherein the first transistor is a double gate transistor with a first gate and a second gate having different gate oxide film thicknesses; and wherein the potentials on the first and second gates are controlled independently of each other.

Further, the first gate may have a smaller gate oxide film thickness than the second gate.

Thus, the drive circuit, which cannot be turned off even when the circuit block is in its standby state, includes a double gate transistor (the first transistor) having an asymmetrical double gate structure (that is, having two gates with different gate insulating film thicknesses). With this arrangement, when the circuit block is not operating, the gate of the double gate transistor having a smaller gate insulating film thickness is turned off and that having a larger gate insulating film thickness is turned on to reduce the leakage current flowing through the gate insulating films while performing a required operation.

Thus, the present invention can reduce the leakage current of a control circuit provided to reduce the leakage current of an LSI circuit by use of a power switch.

DESCRIPTION OF THE PREFERRED EMBODIMENTS

Preferred embodiments of the present invention will now be described in detail with reference to the accompanying drawings.

First Embodiment

Figure 1:
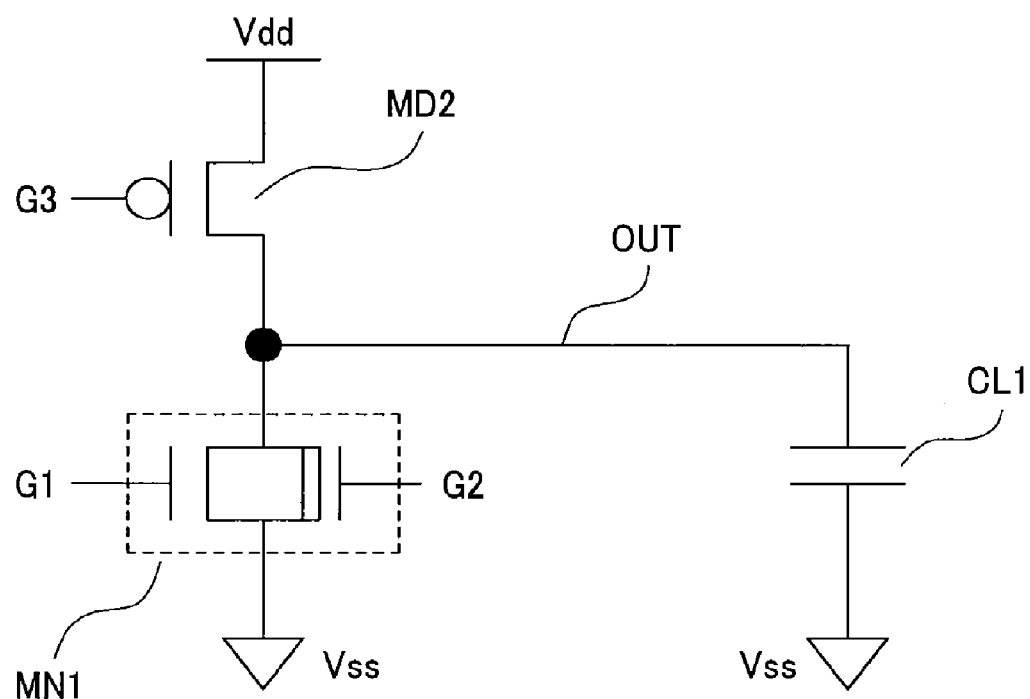
FIG. 1 is a schematic diagram showing the circuit configuration of a load driving circuit according to a first embodiment of the present invention.

FIG. 1 shows a circuit diagram of a load driving circuit according to a first embodiment of the present invention.

Referring to the figure, reference numeral MD1 denotes an n-channel double gate transistor for driving the load; MD2, a p-channel transistor for driving the load; OUT, a load node to be driven; CL1, the load, namely, a capacitor; G1, the first gate of the double gate transistor MD1; G2, the second gate of the double gate transistor MD1; G3, the gate of the transistor MD2; and Vss, a ground potential line.

The following preferred embodiments of the present invention assumes that circuits and circuitry employ a power supply voltage of 1.0 V, a high level voltage of 1.0 V, and a low level voltage of 0 V, unless otherwise stated. However, a power supply voltage other than 1.0 V, for example, 1.2 V or 0.8 V, may be used, with the same effect.

Figure 2:
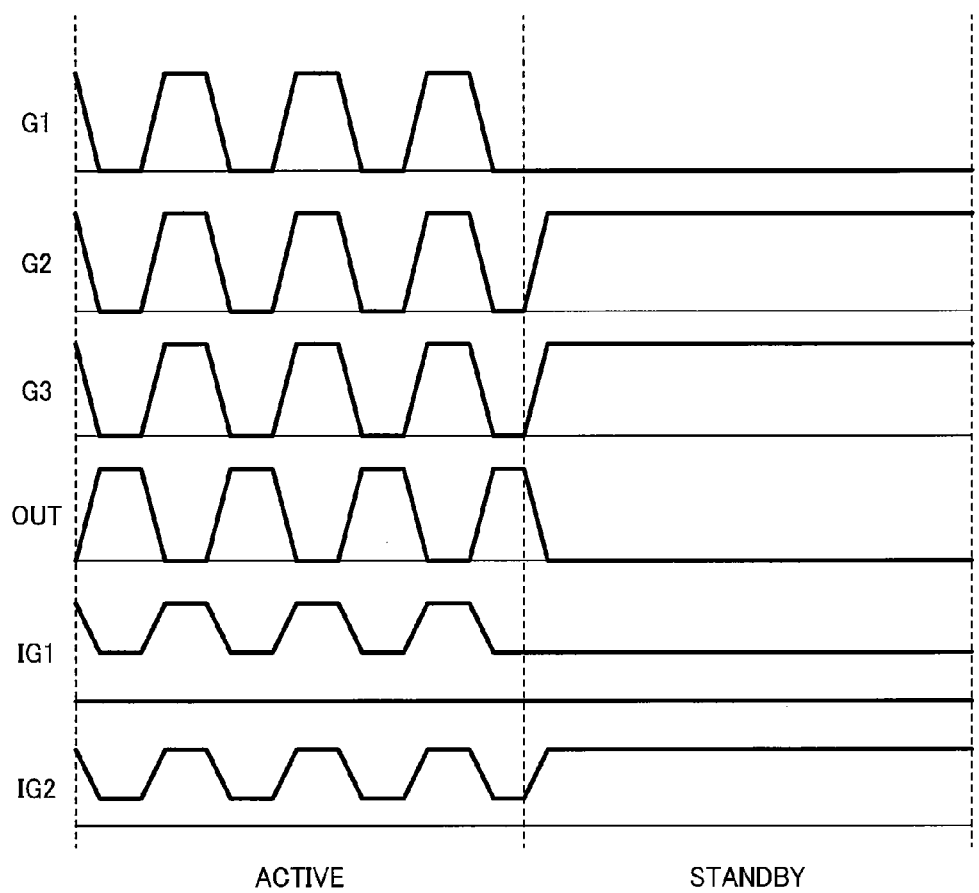
FIG. 2 is a diagram showing the relationships between voltages and currents in the load driving circuit of the first embodiment.

FIG. 2 shows the relationships between the voltages and currents at gates and nodes in the load driving circuit shown in FIG. 1. The operation of the load driving circuit shown in FIG. 1 will now be described with reference to these relationships. According to the present invention, the load circuit (driven by this load driving circuit) is said to be in its active state when it is operating. On the other hand, the load circuit is said to be in its standby state when it is not operating. In FIG. 2, symbol Active indicates the active state, and symbol Standby indicates the standby state. The load circuit assumes the standby state when its operation has been stopped externally, or when the load circuit has stopped its operation since no signal is applied to it. It is necessary to reduce the leakage current of the load circuit in the standby state.

The following description assumes that the load circuit requires that: the voltage at the load node OUT be switched between high and low levels when the load circuit is in the active state; and the voltage at the load node OUT be set to a low level when the load circuit is in the standby state. When the load circuit is in the active state, the same voltage is applied to the two gates of the double gate transistor, and both transistors (i.e., the p-channel transistor MD2 and the double gate transistor MD1) are turned on and off (alternately).

More specifically, in the active state, since (the gate of) the transistor MD2 receives the same voltage as the gates of the double gate transistor MD1, these transistors perform an inverter operation (i.e., together act as an inverter). (In this state, the node OUT to be driven can assume both high and low voltage levels.) When the load circuit is in the standby state, the p-channel transistor MD2 is turned off to set the voltage at the node OUT to a low level. Further, the second gate of the double gate transistor MD1 is set to an on state and hence the voltage at the node OUT is fixed to a low level (as described above). Since the second gate of the transistor MD1 has a large thickness, the gate leakage current flowing through this gate is small. Further, since the voltage of the first gate of the double gate transistor MD1 is set to a low level, the first gate is in an off state. This reduces the leakage current of the first gate of the double gate transistor MD1. (Otherwise, a large gate leakage current flows through this gate.)

Thus, the load driving circuit shown in FIG. 1 exhibits a reduced leakage current while setting the Voltage at the node OUT to a low level.

Figure 3:
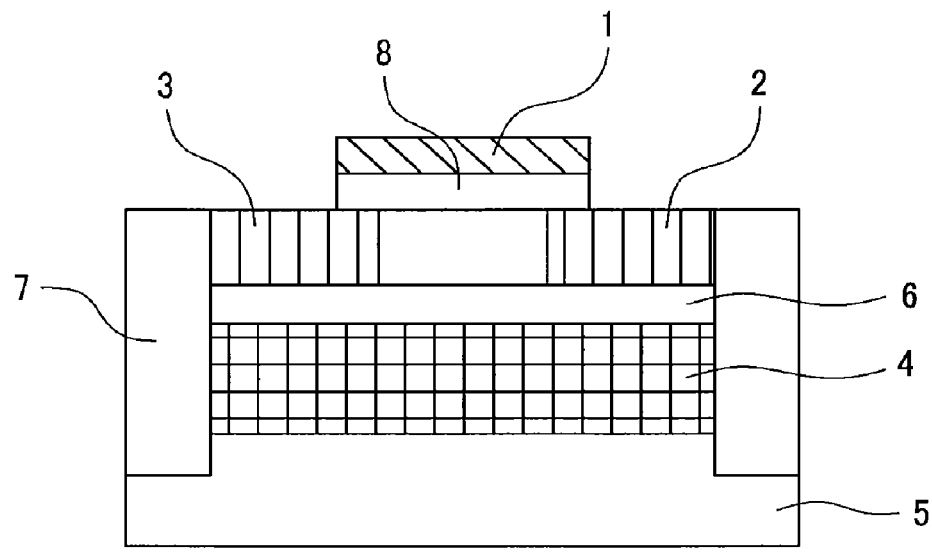
FIG. 3 is a schematic cross-sectional view of a transistor structure according to the first embodiment.

FIG. 3 is a schematic cross-sectional view of the double gate transistor in the circuit shown in FIG. 1. Referring to FIG. 3, reference numeral 1 denotes the first gate; 2, the drain electrode; 3, the source electrode; 4, the second gate; 5, a substrate; 6, a buried oxide (BOX) layer; and 7, trench isolation regions. This transistor is a double gate transistor having a fully depleted SOI (FD-SOI) structure in which a well layer acts as the second gate. The second gate insulating film of this transistor is the buried oxide layer (6) in the FD-SOI structure. Thus, in this double gate transistor, the gate insulating film for the first gate is thin (approximately 2 nm) and that for the second gate is thick (approximately 10 nm). Therefore, the double gate transistor can be regarded as being made up of two transistors having different gate insulating film thicknesses and hence different transistor characteristics.

The following description of the present invention assumes the thicknesses of the insulating films for the first and second gates to be approximately 2 nm and 10 nm, respectively. However, they may be set to other values as long as the insulating film for the first gate is thinner than that for the second gate, with the same effect. For example, the insulating film for the first gate may have a thickness of approximately 1.2 nm and that for the second gate may have a thickness of approximately 5 nm. This still achieves the same effect as described above.

Figure 4:
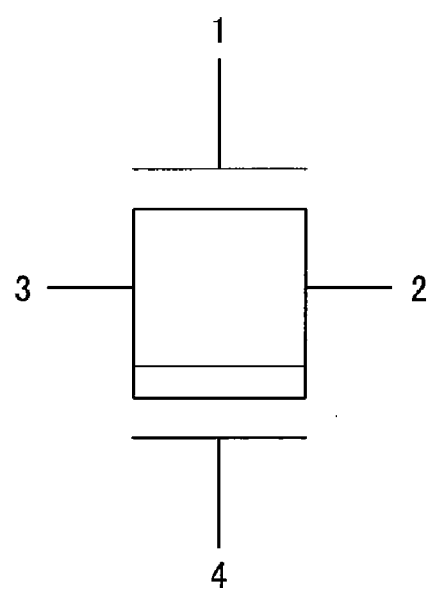
FIG. 4 is a diagram showing an equivalent circuit of the transistor according to the first embodiment.

FIG. 4 shows an equivalent circuit of the transistor structure shown in FIG. 3. Referring to FIG. 4, reference numeral 1 denotes the first gate; 2, the drain electrode; 3, the source electrode; and 4, the second gate. The circuit shown in FIG. 1 employs this transistor.

Figure 5:
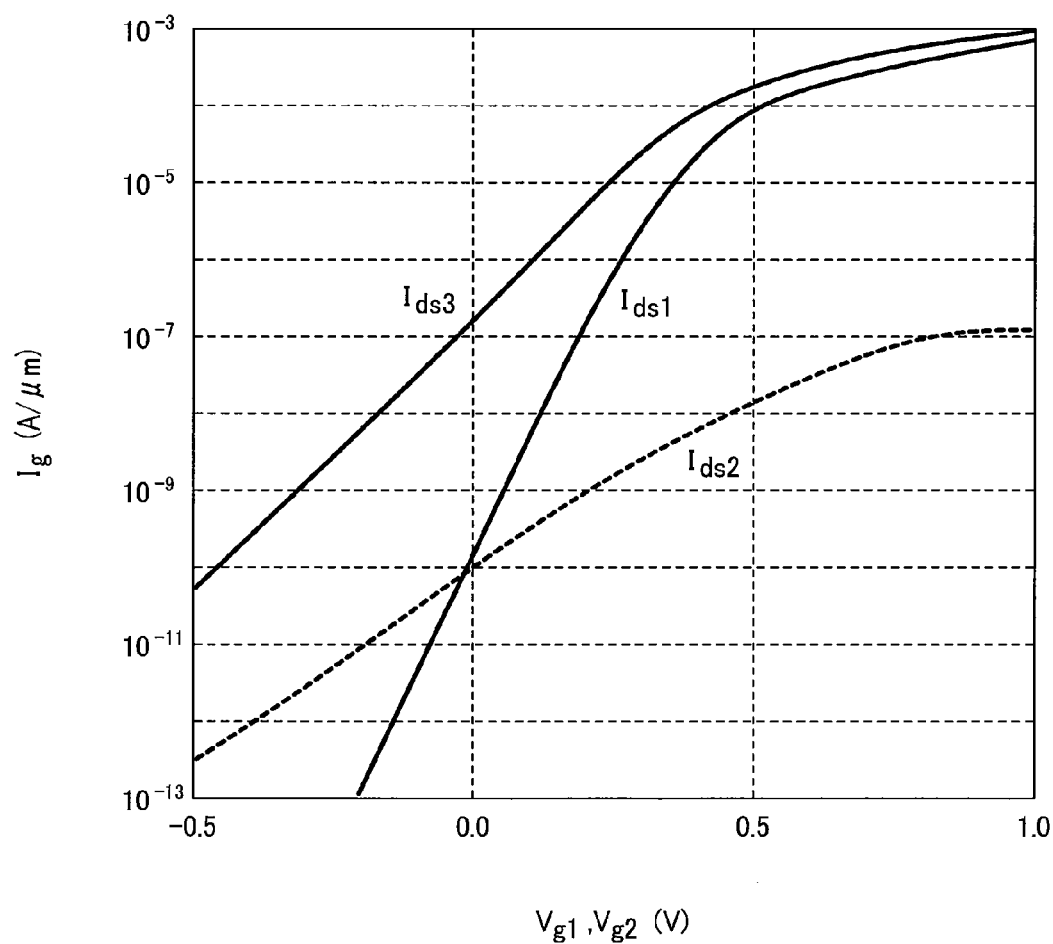
FIG. 5 is a diagram showing current characteristics of the transistor according to the first embodiment.

FIG. 5 shows current characteristics of the double gate transistor shown in FIG. 3. Symbol Ids1 indicates the source-drain current of the transistor when the voltage on the first gate is varied with the second gate set in an off state. This source-drain current characteristic is not much different from those of bulk transistors. Symbol Ids2 indicates the source-drain current of the transistor when the voltage on the second gate is varied with the first gate set in an off state. Since the gate insulating film for the second gate has a larger thickness than the gate insulating film for the first gate, the source-drain current is smaller when the second gate is turned on than when the first gate is turned on. Further, symbol Ids3 indicates the source-drain current of the transistor when the voltage on the first gate is varied with the second gate set in an on state. In this case, since the second gate is in the on state, a current flows even though the first gate is turned off. In this state, turning on the first gate increases the current. Thus, the source-drain current is larger when both the first and second gates are turned on than when only the first gate is turned on.

Figure 6:
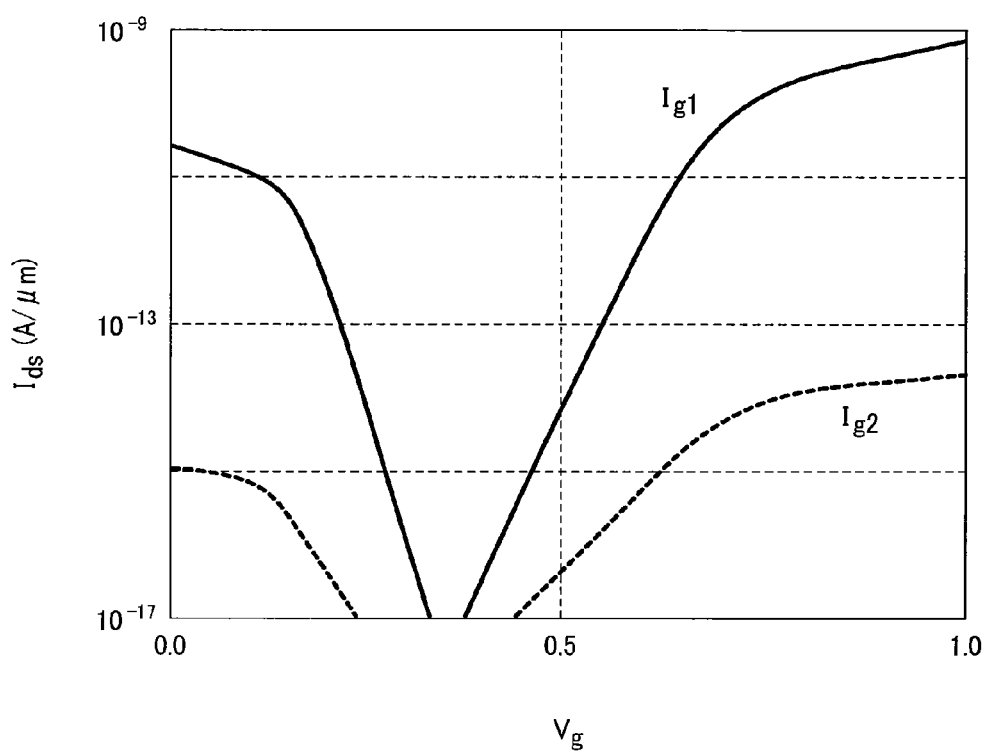
FIG. 6 is a diagram showing other current characteristics of the transistor according to the first embodiment.

FIG. 6 shows leakage currents flowing between the gate and the source and drain electrodes of the double gate transistor shown in FIG. 3. Symbol Ig1 indicates changes in the gate leakage current flowing from the first gate when its voltage is varied. When the gate voltage is at a high level and hence the transistor is turned on, the gate leakage current is large. On the other hand, when the transistor is turned off, the gate leakage current is small (one or more orders of magnitude smaller than when the transistor is on). Symbol Ig2 indicates changes in the gate leakage current flowing from the second gate when its voltage is varied. Since the gate insulating film for the second gate has a larger thickness than the gate insulating film for the first gate, the gate leakage current of the second gate is approximately 100,000 times smaller than the above gate leakage current of the first gate.

The load driving circuit of the present embodiment described above employs an n-channel double gate transistor to set the voltage at the node OUT to a low level. However, if the load circuit requires that the voltage at the node OUT be set to a high level, a p-channel double gate transistor may be used, instead of the n-channel double gate transistor, to reduce the leakage current. Further, although the above load driving circuit uses an inverter circuit to drive the node OUT, a logic circuit such as a NAND or NOR circuit may be used instead. Also in this case, the leakage current of the load driving circuit can be reduced by turning on (only) the second gate of the double gate transistor when setting the voltage at the node OUT to a fixed level.

Second Embodiment

Figure 7:
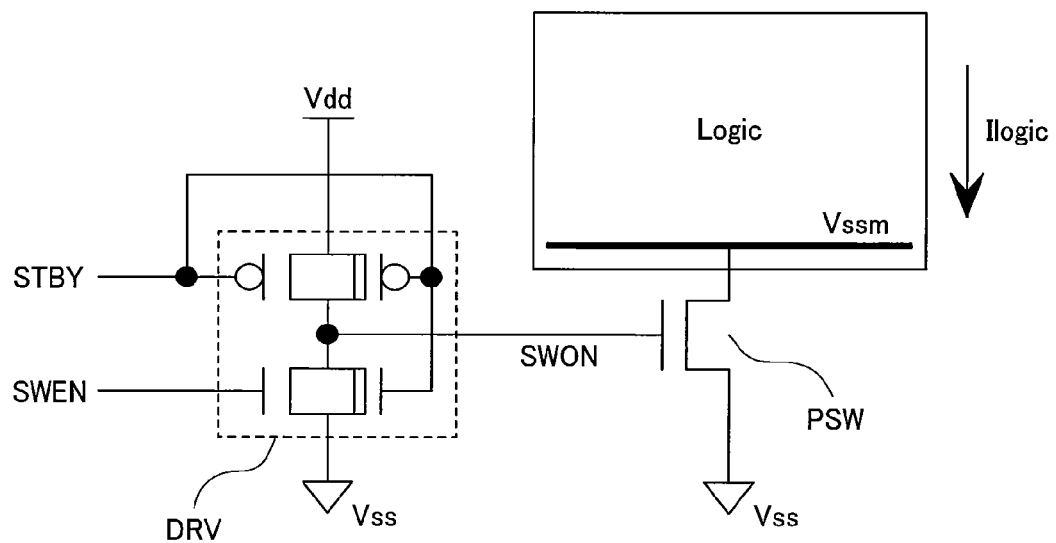
FIG. 7 is a schematic diagram showing a circuit block and leakage current reduction circuitry therefor according to a second embodiment of the present invention.

FIG. 7 shows a circuit diagram of leakage current reduction circuitry according to a second embodiment of the present invention. Referring to the figure, symbol Logic denotes an integrated circuit block including many circuits; Vssm, a ground potential line within the circuit block Logic; STBY, a standby signal, which is set at a high level when the circuit block Logic is in its standby state; PSW, a power switch used to cut off power supply to the circuit block Logic; SWON, a signal for controlling the power switch PSW; DRV, a drive circuit for generating the signal SWON (or driving the power switch PSW); SWEN, a signal for controlling the drive circuit DRV; and Ilogic, a current flowing through the circuit block Logic.

Figure 8:
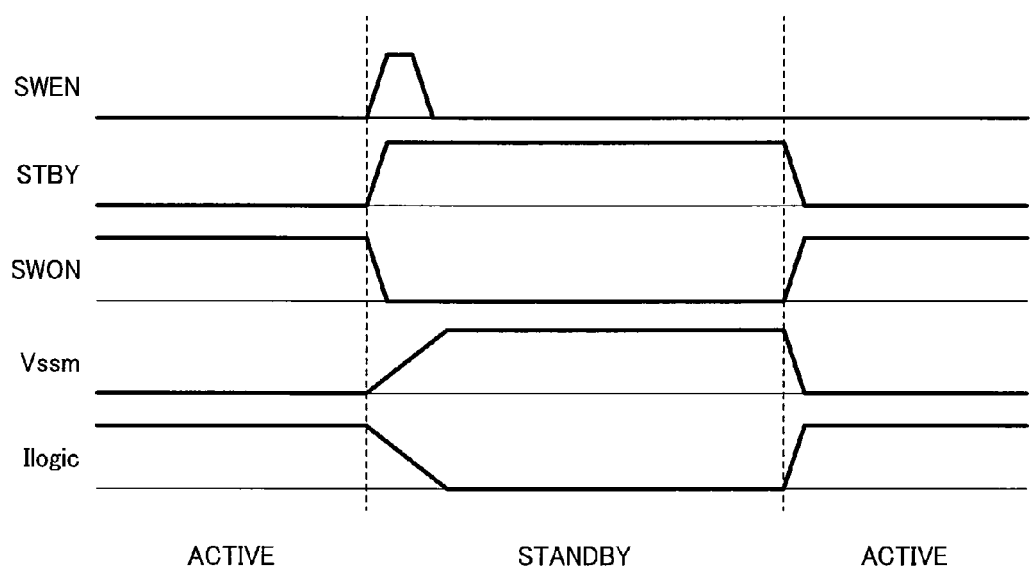
FIG. 8 is a diagram showing the relationships between voltages and currents in the circuit block and in the leakage current reduction circuitry therefor according to the second embodiment.

FIG. 8 shows changes in node (or signal) voltages and currents in the circuitry shown in FIG. 7. When the circuit block Logic is in the active state, the power switch PSW is turned on and hence the ground potential line Vssm is set to ground potential Vss, allowing the circuit block Logic to operate properly. At that time, the control signals STBY and SWEN (applied to the drive circuit DRV for generating the power switch control signal SWON) are set at a low level, which sets the control signal SWON to a high level. When the circuit block Logic has switched from the active state to the standby state, the voltage of the control signal SWEN is set to a high level for a predetermined period of time, turning on the first gate of the n-channel double gate transistor in the drive circuit DRV. As a result, the voltage of the control signal SWON rapidly falls to a low level, turning off the power switch PSW. This results in an increase in the potential of the ground potential line Vssm of the circuit block Logic and hence a significant reduction in the leakage current Ilogic flowing through the circuit block Logic.

When the circuit block is in the standby state, the voltage of the control signal SWEN is normally at a low level (except for the above predetermined period of time), thereby reducing the gate leakage current flowing from the first gate of the n-channel double gate transistor in the drive circuit DRV. Further, since the second gate is turned on, the voltage of the control signal SWON for controlling the power switch PSW is maintained at a low level, preventing the power switch PSW from turning on.

Thus, the present embodiment allows a reduction in the leakage currents of both a circuit block (Logic) and a leakage current reduction circuit (or drive circuit) therefor.

Third Embodiment

Figure 9:
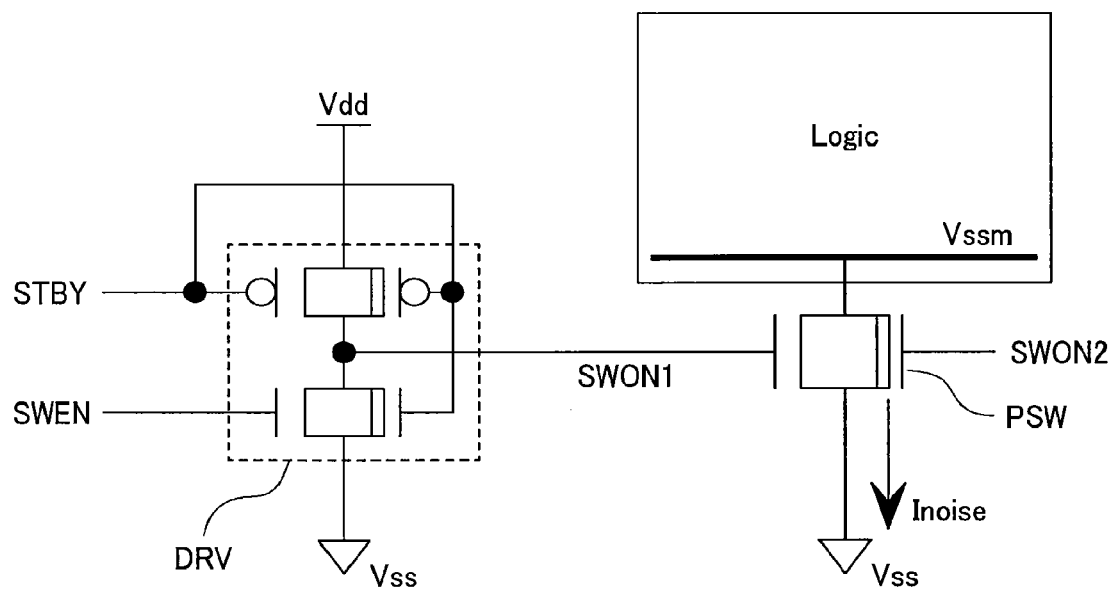
FIG. 9 is a schematic diagram showing a circuit block and leakage current reduction circuitry therefor according to a third embodiment of the present invention.

FIG. 9 shows a circuit diagram of leakage current reduction circuitry according to a third embodiment of the present invention. Referring to the figure, symbol Logic denotes an integrated circuit block including many circuits; Vssm, a ground potential line within the circuit block Logic; STBY, a standby signal, which is set at a high level when the circuit block Logic is in its standby state; PSW, a power switch made up of a double gate transistor and used to cut off power supply to the circuit block Logic; SWON1, a signal for controlling the first gate of the power switch PSW (made up of the double gate transistor); SWON2, a signal for controlling the second gate of the power switch PSW (made up of the double gate transistor); DRV, a drive circuit for generating the control signals SWON1 and SWON2 (or driving the power switch PSW); SWEN, a signal for controlling the drive circuit DRV; and Inoise, the current flowing from the power switch PSW to a ground potential line Vss. It should be noted that the ground potential line Vss is a common ground line for the circuits on the semiconductor chip on which this circuitry is mounted.

Figure 10:
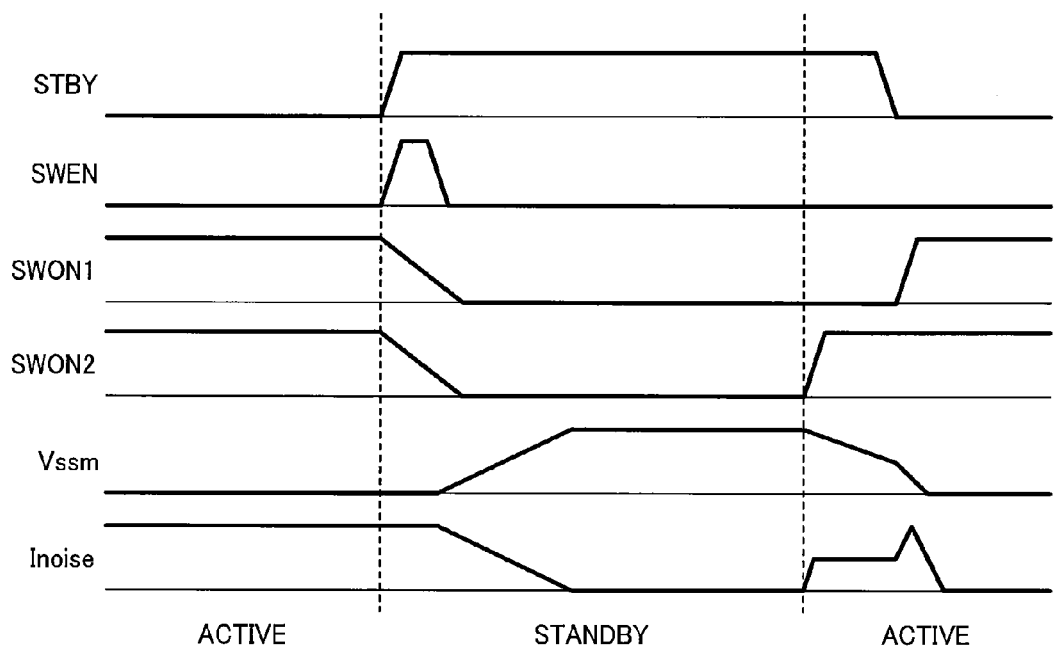
FIG. 10 is a diagram showing the relationships between voltages and currents in the circuit block and in the leakage current reduction circuitry therefor according to the third embodiment.

FIG. 10 shows changes in node (or signal) voltages and currents in the circuitry shown in FIG. 9. When the circuit block Logic is in the active state, the power switch PSW is turned on and hence the ground potential line Vssm is set to ground potential Vss, allowing the circuit block Logic to operate properly. At that time, the control signals STBY and SWEN (applied to the drive circuit DRV for generating the power switch control signals SWON1 and SWON2) are set at a low level, which sets the control signals SWON1 and SWON2 to a high level.

When the circuit block Logic has switched from the active state to the standby state, the voltage of the control signal SWEN is set to a high level for a predetermined period of time, turning on the first gate of the n-channel double gate transistor in the drive circuit DRV. As a result, the voltages of the control signals SWON1 and SWON2 rapidly fall to a low level, turning off the power switch PSW. This results in an increase in the potential of the ground potential line Vssm of the circuit block Logic and hence a significant reduction in the leakage current flowing through the circuit block Logic. When the circuit block Logic is not operating (that is, when it is in its standby state), the voltage of the control signal SWEN is normally at a low level (except for the above predetermined period of time), thereby reducing the gate leakage current flowing from the first gate of the n-channel double gate transistor in the drive circuit DRV. Further, since the second gate of the n-channel double gate transistor is turned on, the voltages of the control signals SWON1 and SWON2 for controlling the power switch PSW are maintained at a low level, preventing the power switch PSW from turning on.

On the other hand, when the circuit block Logic has switched from the standby state to the active state, first the voltage of the control signal SWON2 rises from a low level to a high level, turning on the power switch PSW. As a result, the potential of the ground potential line Vssm approaches ground potential Vss. Then, after a predetermined period of time, the voltage of the control signal SWON1 rises from a low level to a high level, turning on the first gate of the double gate transistor constituting the power switch PSW. (As a result, both gates of the double gate transistor are on.)

It should be noted that the ground potential line Vss is connected to not only the circuit block Logic but also other circuits on the semiconductor chip. Therefore, if the magnitude of the current Inoise is large, the potential of the ground potential line Vss varies with variations in the current Inoise. This affects the operations of circuits connected to the ground potential line Vss other than the circuit block Logic, which might lead to a malfunction if there is a large variation in the potential of the ground potential line Vss. When the circuit block Logic has switched from the standby state to the active state, if the first and second gates of the power switch PSW are turned on at the same time, a large current (Inoise) flows through the power switch PSW since the charge on the ground potential line Vssm is rapidly drawn. This causes a variation in the potential of the ground potential line Vss, resulting in malfunction of other circuits on the same semiconductor chip.

According to the present embodiment, to prevent the above malfunction from occurring, the voltage of the control signal SWON2 is raised to a high level before raising the voltage of the control signal SWON1. (That is, the second gate is turned on before turning on the first gate.) This arrangement allows a reduction in the current Inoise flowing from the power switch PSW to the ground potential line Vss, since the driving current of the transistor (i.e., the power switch PSW) is small when only the second gate is turned on. This prevents malfunction of the circuits connected to the ground potential line Vss. The first gate is turned on when the potential of the ground potential line Vssm has decreased to a certain level after turning on the second gate, which prevents the current Inoise from increasing to a high level. Further, when the circuit block Logic is in the active state, turning on both gates of the power switch PSW increases the magnitude of current that can be passed through the power switch PSW, resulting in reliable operation of the circuit block Logic.

Further, in this circuit configuration, when the power switch PSW is in an on state, both the first and second gates of the double gate transistor constituting the switch are turned on. Therefore, this power switch PSW allows a higher current to pass, as compared to when a common single gate transistor is used as the power switch PSW or only the first gate of the double gate transistor is turned on. This means that inserting this power switch (between the circuit block Logic and the ground potential line Vss) does not lead to as much reduction in the current (flowing through the circuit block Logic) as inserting a conventional power switch. Therefore, the above power switch configuration has an advantage over conventional power switch configurations.

Thus, the present embodiment allows a reduction in the leakage currents of both a circuit block and a leakage current reduction circuit therefor that uses a power switch to reduce the leakage current of the circuit block. The present embodiment also prevents variations in the power supply voltage of the circuits on the semiconductor chip on which the circuit block is mounted, thereby preventing malfunction of these circuits.

Fourth Embodiment

Figure 11:
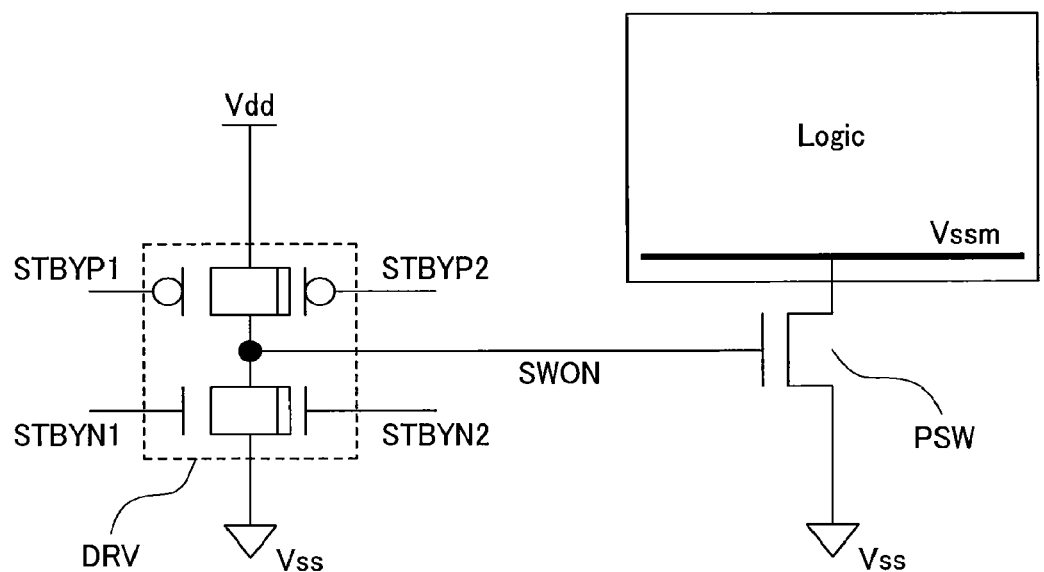
FIG. 11 is a schematic diagram showing a circuit block and leakage current reduction circuitry therefor according to a fourth embodiment of the present invention.

FIG. 11 shows a circuit diagram of leakage current reduction circuitry according to a fourth embodiment of the present invention. Referring to the figure, symbol Logic denotes an integrated circuit block including many circuits; Vssm, a ground potential line within the circuit block Logic; PSW, a power switch used to cut off power supply to the circuit block Logic; SWON, a signal for controlling the power switch PSW; DRV, a drive circuit for generating the control signal SWON; STBYN1, a signal for controlling the first gate of the n-channel double gate transistor in the drive circuit DRV for generating the control signal SWON (or driving the power switch PSW); STBYN2, a signal for controlling the second gate of the re-channel double gate transistor in the drive circuit DRV for generating the control signal SWON; STBYP1, a signal for controlling the first gate of the p-channel double gate transistor in the drive circuit DRV for generating the control signal SWON; and STBYP2, a signal for controlling the second gate of the p-channel double gate transistor in the drive circuit DRV for generating the control signal SWON.

Figure 12:
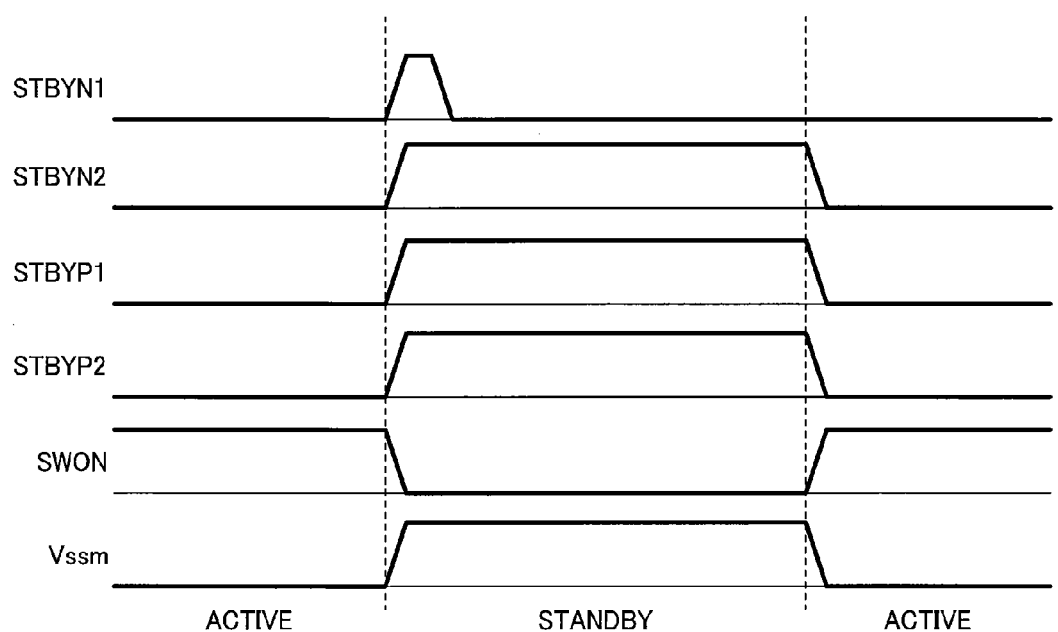
FIG. 12 is a diagram showing the relationships between voltages in the circuit block and in the leakage current reduction circuitry therefor according to the fourth embodiment.

FIG. 12 shows changes in node (or signal) voltages in the circuitry shown in FIG. 11. When the circuit block Logic is in the active state, the control signals STBYP1 and STBYP2 for controlling the p-channel transistor in the drive circuit DRV (for generating the power switch control signal SWON) are at a low level and hence the p-channel transistor is turned on, setting the control signal SWON to a high level. As a result, the power switch PSW is turned on, setting the ground potential line Vssm to ground potential Vss so as to allow the circuit block Logic to operate properly.

When the circuit block Logic has switched from the active state to the standby state, the voltage of the control signal STBYN1 is set to a high level for a predetermined period of time, turning on the first gate of the n-channel double gate transistor in the drive circuit DRV. (At that time, the second gate of the n-channel double gate transistor is also turned on.) As a result, the voltage of the control signal SWON rapidly falls to a low level. At the same time, the voltages of the control signals STBYP1 and STBYP2 for controlling the gate electrodes of the p-channel transistor in the drive circuit DRV are set to a high level, preventing a charge current from flowing through the gate of the power switch PSW.

As a result, the power switch PSW is turned off and hence the potential of the ground potential line Vssm of the circuit block Logic rises, drastically reducing the leakage current of the circuit block Logic. When the circuit block Logic is in the standby state, the voltage of the control signal STBYN1 is normally at a low level (except for the above predetermined period of time), thereby reducing the gate leakage current flowing from the first gate of the n-channel transistor in the drive circuit DRV. Further, since the second gate of the n-channel double gate transistor is turned on, the voltage of the control signal SWON for controlling the power switch PSW is maintained at a low level, preventing the power switch PSW from turning on.

Thus, the present embodiment allows a reduction in the leakage currents of both a circuit block and a leakage current reduction circuit therefor that uses a power switch to reduce the leakage current of the circuit block. The present embodiment also allows fine adjustment of the operation of the power switch.

Fifth Embodiment

Figure 13:
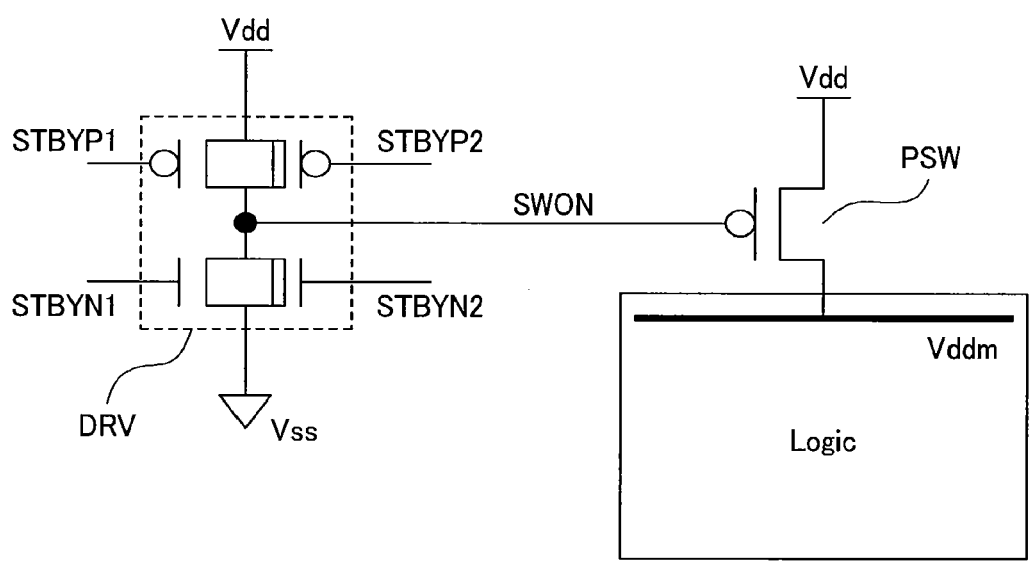
FIG. 13 is a schematic diagram showing a circuit block and leakage current reduction circuitry therefor according to a fifth embodiment of the present invention.

FIG. 13 shows a circuit diagram of leakage current reduction circuitry according to a fifth embodiment of the present invention. Referring to the figure, symbol Logic denotes an integrated circuit block including many circuits; Vddm, a power supply voltage line within the circuit block Logic; PSW, a power switch used to cut off power supply to the circuit block Logic; SWON, a signal for controlling the power switch PSW; DRV, a drive circuit for generating the control signal SWON (or driving the power switch PSW); STBYN1, a signal for controlling the first gate of the n-channel double gate transistor in the drive circuit DRV for generating the control signal SWON; STBYN2, a signal for controlling the second gate of the n-channel double gate transistor in the drive circuit DRV for generating the control signal SWON; STBYP1, a signal for controlling the first gate of the p-channel double gate transistor in the drive circuit DRV for generating the control signal SWON; and STBYP2, a signal for controlling the second gate of the p-channel double gate transistor in the drive circuit DRV for generating the control signal SWON.

Figure 14:
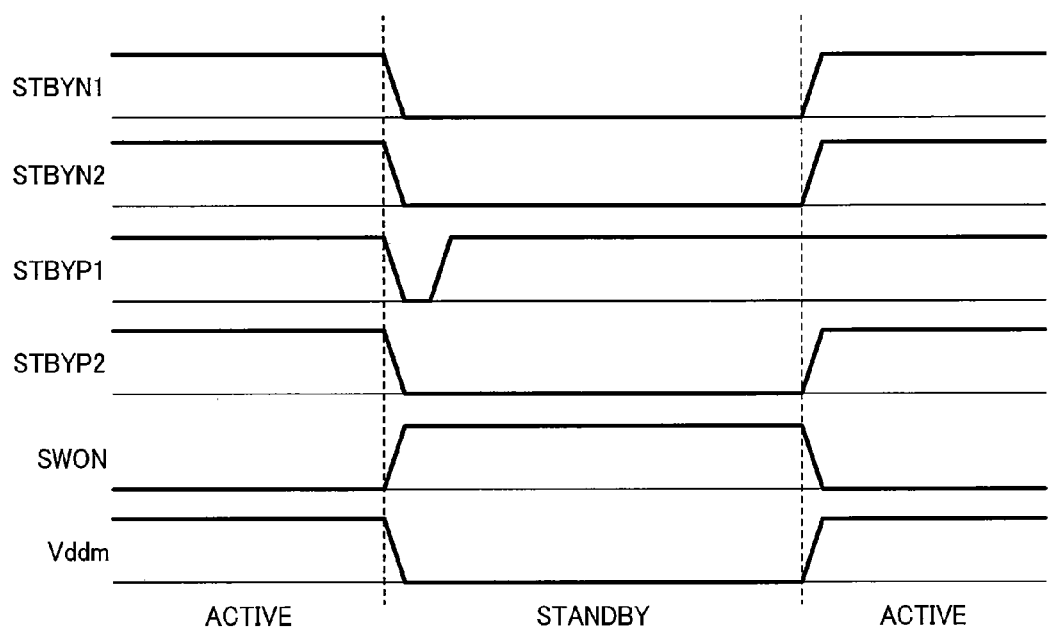
FIG. 14 is a diagram showing the relationships between voltages in the circuit block and in the leakage current reduction circuitry therefor according to the fifth embodiment.

FIG. 14 shows changes in node (or signal) voltages in the circuitry shown in FIG. 13. When the circuit block Logic is in the active state, the control signals STBYN1 and STBYN2 for controlling the n-channel double gate transistor in the drive circuit DRV (for generating the power switch control signal SWON) are at a high level and hence the n-channel transistor is turned on, setting the control signal SWON to a low level. As a result, the power switch PSW is turned on, setting the power supply voltage line Vddm to power supply voltage Vdd so as to allow the circuit block Logic to operate properly.

When the circuit block Logic has switched from the active state to the standby state, the voltage of the control signal STBYP1 is set to a low level for a predetermined period of time, turning on the first gate of the p-channel double gate transistor in the drive circuit DRV. (At that time, the second gate of the p-channel double gate transistor is also turned on.) As a result, the voltage of the control signal SWON rapidly rises to a high level. At the same time, the voltages of the control signals STBYN1 and STBYN2 for controlling the gate electrodes of the n-channel double gate transistor in the drive circuit DRV are set to a low level, preventing a charge current from flowing through the gate of the power switch PSW.

As a result, the power switch PSW is turned off and hence the potential of the power supply voltage line Vddm of the circuit block Logic falls, drastically reducing the leakage current of the circuit block Logic. When the circuit block Logic is in the standby state, the voltage of the control signal STBYP1 is normally at a high level (except for the above predetermined period of time), thereby reducing the gate leakage current flowing from the first gate of the p-channel double gate transistor in the drive circuit DRV. Further, since the second gate of the p-channel transistor is turned on, the voltage of the control signal SWON for controlling the power switch PSW is maintained at a high level, preventing the power switch PSW from turning on.

Thus, the present embodiment allows a reduction in the leakage currents of both a circuit block and a leakage current reduction circuit therefor that uses a power switch made up of a p-channel transistor to reduce the leakage current of the circuit block. The present embodiment also allows fine adjustment of the operation of the power switch.

Sixth Embodiment

Figure 15:
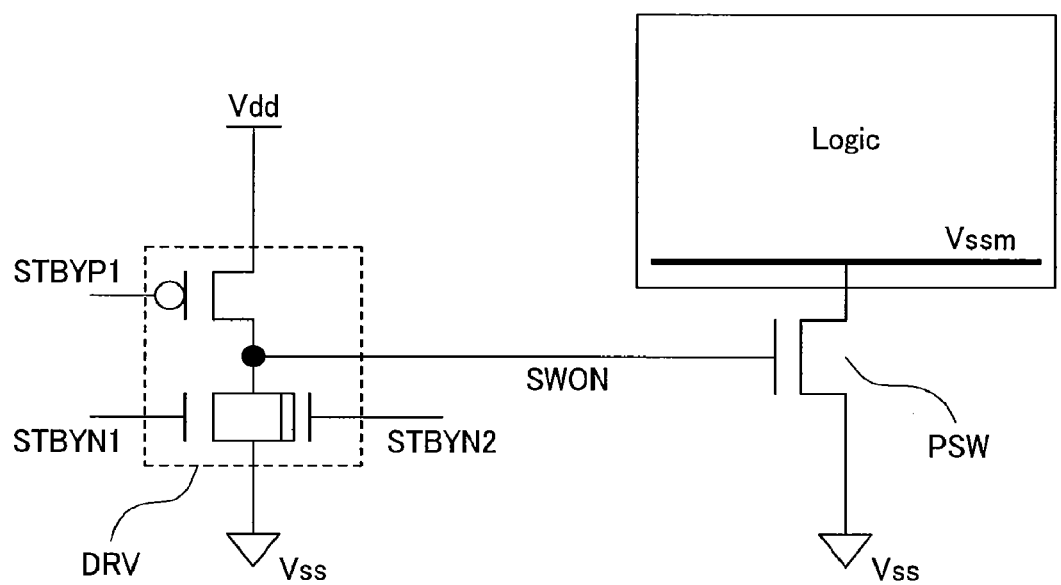
FIG. 15 is a schematic diagram showing a circuit block and leakage current reduction circuitry therefor according to a sixth embodiment of the present invention.

FIG. 15 shows a circuit diagram of leakage current reduction circuitry according to a sixth embodiment of the present invention. Referring to the figure, symbol Logic denotes an integrated circuit block including many circuits; Vssm, a ground potential line within the circuit block Logic; PSW, a power switch used to cut off power supply to the circuit block Logic; SWON, a signal for controlling the power switch PSW; DRV, a drive circuit for generating the control signal SWON (or driving the power switch PSW); STBYN1, a signal for controlling the first gate of the n-channel double gate transistor in the drive circuit DRV for generating the control signal SWON; STBYN2, a signal for controlling the second gate of the n-channel double gate transistor in the drive circuit DRV for generating the control signal SWON; and STBYP1, a signal for controlling the gate of the p-channel transistor in the drive circuit DRV for generating the control signal SWON.

Figure 16:
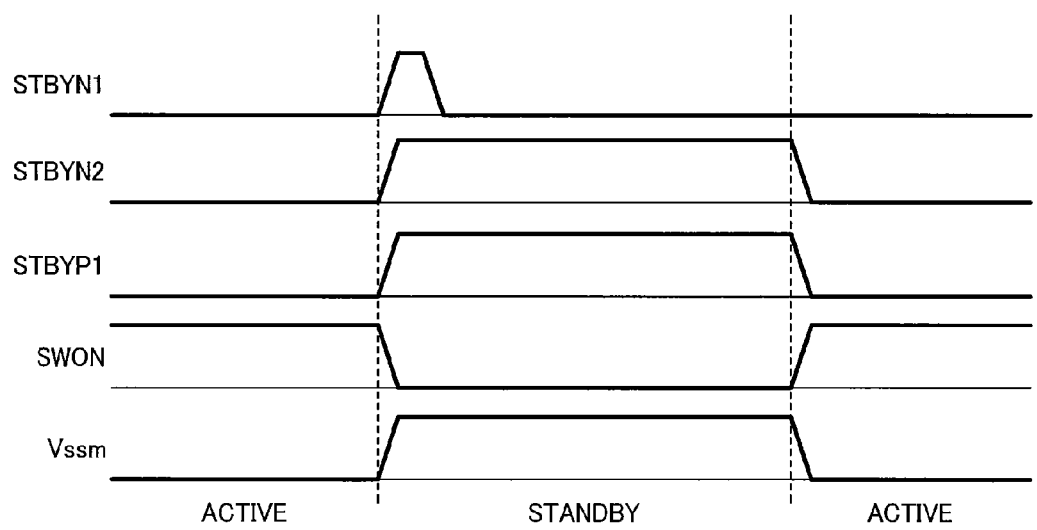
FIG. 16 is a diagram showing the relationships between voltages in the circuit block and in the leakage current reduction circuitry therefor according to the sixth embodiment.

FIG. 16 shows changes in node (or signal) voltages in the circuitry shown in FIG. 15. When the circuit block Logic is in the active state, the control signal STBYP1 for controlling the p-channel transistor in the drive circuit DRV (for generating the power switch control signal SWON) is at a low level and hence the p-channel transistor is turned on, setting the control signal SWON to a high level. As a result, the power switch PSW is turned on, setting the ground potential line Vssm to ground potential Vss so as to allow the circuit block Logic to operate properly.

When the circuit block Logic has switched from the active state to the standby state, the voltage of the control signal STBYN1 is set to a high level for a predetermined period of time, turning on the first gate of the n-channel double gate transistor in the drive circuit DRV. (At that time, the second gate of the n-channel double gate transistor is also turned on.) As a result, the voltage of the control signal SWON rapidly falls to a low level. At the same time, the voltage of the control signal STBYP1 for controlling the gate electrode of the p-channel transistor in the drive circuit DRV is set to a high level, preventing a charge current from flowing through the gate of the power switch PSW.

As a result, the power switch PSW is turned off and hence the potential of the ground potential line Vssm of the circuit block Logic rises, drastically reducing the leakage current of the circuit block Logic. When the circuit block Logic is in the standby state, the voltage of the control signal STBYN1 is normally at a low level (except for the above predetermined period of time), thereby reducing the gate leakage current flowing from the first gate of the n-channel double gate transistor in the drive circuit DRV. Further, since the second gate of the n-channel double gate transistor is turned on, the voltage of the control signal SWON for controlling the power switch PSW is maintained at a low level, preventing the power switch PSW from turning on.

Thus, the present embodiment allows a reduction in the leakage currents of both a circuit block and a leakage current reduction circuit therefor. As exemplified by the present embodiment, the p-channel transistor in the drive circuit for generating the control signal SWON may be a single gate transistor instead of a double gate transistor. This also produces the same leakage current reduction effect as the first to fifth embodiments. Further, the present embodiment has been described with reference to a circuit configuration in which the power switch is inserted between the circuit block and the ground potential line Vssm. However, the present embodiment can be applied to a circuit configuration in which the power switch is inserted between the circuit block and the power supply voltage line Vddm, as in the fifth embodiment. In such a case, a single gate transistor may be used as the n-channel transistor in the drive circuit for generating the control signal SWON, and a double gate transistor may be used as the p-channel transistor in the drive circuit. This arrangement also allows a reduction in the leakage currents of both the circuit block and the leakage current reduction circuit therefor.

Seventh Embodiment

Figure 17:
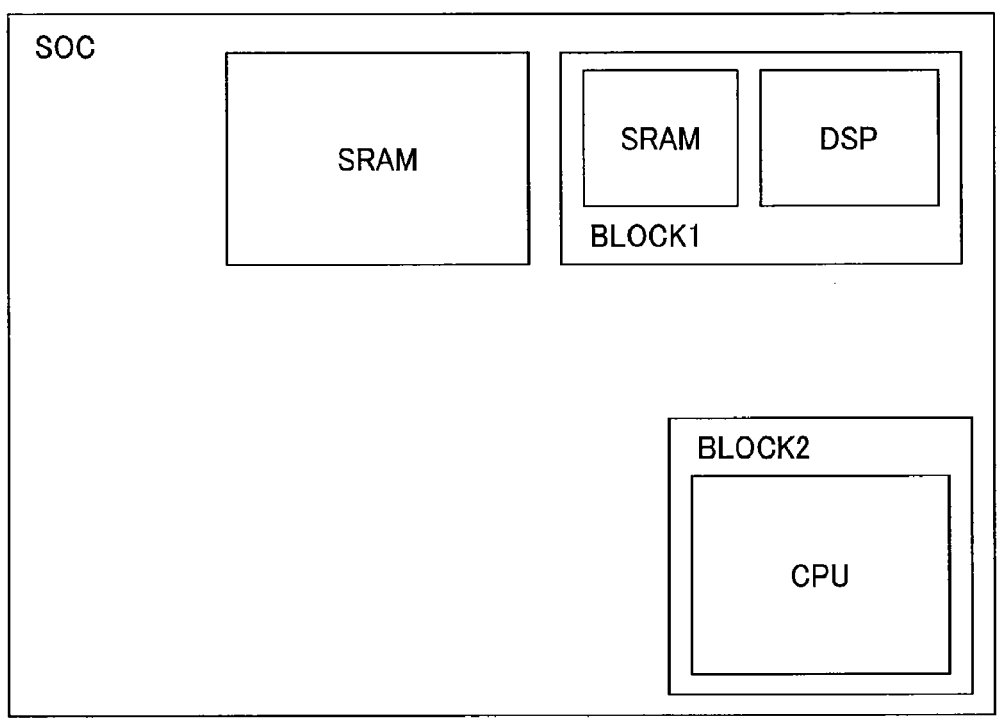
FIG. 17 is a block diagram showing an SoC according to a seventh embodiment of the present invention.

FIG. 17 is a simple block diagram showing an SoC (System on a Chip), which is an LSI chip on which a plurality of circuit modules having different functions are mounted. Referring to the figure, symbol SOC denotes a single semiconductor chip; CPU and DSP, modules for processing an input signal and outputting the processed signal; SRAM and RAM, modules for storing data; and BLOCK1 and BLOCK2, circuit blocks each including one or more circuits. The circuit blocks BLOCK1 and BLOCK2 shown in FIG. 17 correspond to the circuit block Logic in the second to sixth embodiments. That is, the leakage currents of the circuit blocks BLOCK1 and BLOCK2 in their standby state can be reduced by using the techniques described in connection with these embodiments.

One of the most important circuits in an SoC is the SRAM circuit. An SRAM circuit must retain data even when in its standby state. Therefore, the above leakage current reduction methods of the second to sixth embodiments cannot be applied to SRAM circuits, since these methods entirely cut off power supply to the circuit block (or SRAM circuit), which leads to data destruction. To circumvent this problem, the leakage current of the memory cell array portion of an SRAM circuit may be reduced by adjusting its power supply voltage. As for the other portions, a power switch may be used to reduce their leakage current, as in the above embodiments.

Figure 18:
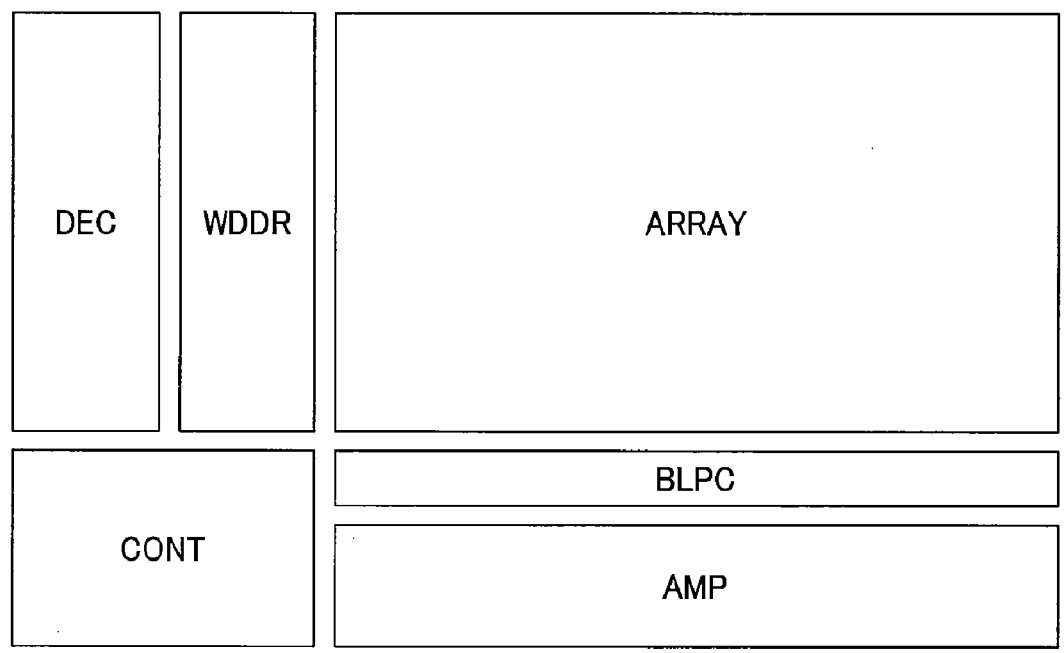
FIG. 18 is a block diagram showing an SRAM circuit according to the seventh embodiment.

FIG. 18 is a schematic diagram showing an SRAM circuit. Referring to the figure, symbol ARRAY denotes a memory cell array made up of a plurality of SRAM memory cells arranged in an array; WDDR, a word line driver for driving word lines; DEC, a decoder circuit connected to the input side of the word line driver WDDR; BLPC, a precharge circuit for precharging bit lines; AMP, direct peripheral circuits provided for their respective columns and including a sense amplifier, a write circuit, a data latch, etc.; and CONT, a control circuit for controlling the SRAM circuit.

Since the decoder circuit DEC, the peripheral circuits AMP (provided for their respective columns), and the control circuit CONT need not retain data when the SRAM circuit is in the standby state, their leakage current can be reduced using the power switch described in connection with the second to sixth embodiments.

Figure 19:
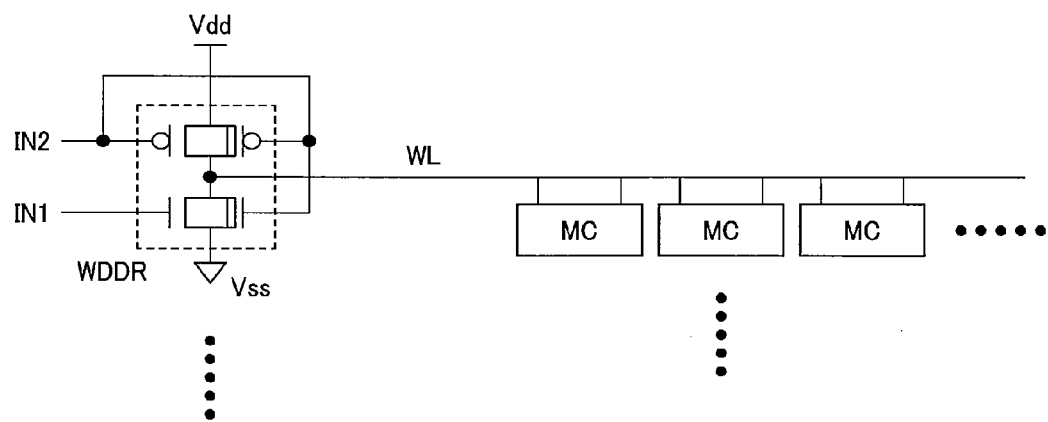
FIG. 19 is a schematic diagram showing the word line driver circuit of the SRAM circuit according to the seventh embodiment.

FIG. 19 shows the configuration of the word line driver WDDR. Referring to the figure, symbols IN1 and IN2 denote address decode signals; WL, a word line; and MC, memory cells.

Figure 20:
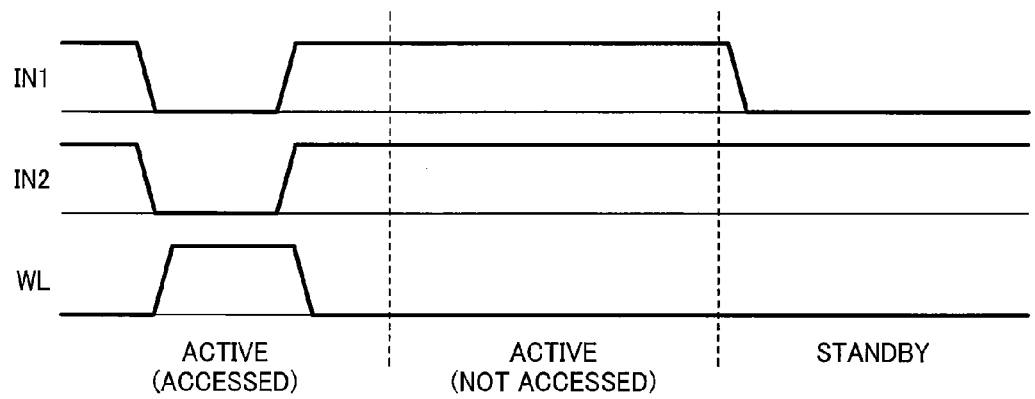
FIG. 20 is a diagram showing the relationships between voltages in the word line driver circuit of the SRAM circuit according to the seventh embodiment.

FIG. 20 shows changes in node (or signal) voltages in the circuit shown in FIG. 19. Referring to FIG. 20; symbol Active (accessed) indicates the voltage state of the SRAM circuit when the word line WL is accessed. In this state, the voltages of the input signals IN1 and IN2 of the word line driver fall to a low level and hence the voltage of the word line WL rises to a high level, meaning that the word line WL has been selected. Symbol Active (not accessed), on the other hand, indicates the voltage state of the SRAM circuit when it is in the active state but the word line WL is not selected.

In this state, the voltages of the input signals IN1 and IN2 of the word line driver are at a high level and hence the voltage of the word line WL is at a low level, meaning that the word line WL has not been selected. In this state, the first gate of the n-channel double gate transistor in the word line driver WDDR is turned on, with the result that a large gate leakage current flows through the gate. Symbol Standby indicates the voltage state when the SRAM circuit is in the standby state. In this state, although the SRAM circuit is not operating, the voltage of the word line WL is set to a low level to retain data. At that time, a low level voltage is applied to the first gate of the n-channel double gate transistor in the word line driver WDDR to turn off this gate. As a result, the gate leakage current of the first gate is reduced, as compared to when the gate is turned on.

Further, a high level voltage is applied to the second gate of the n-channel double gate transistor in the word line driver WDDR to turn on this gate and thereby set the voltage of the word line WL to a low level. Since the gate insulating film for the second gate has a large thickness, the gate leakage current of the second gate is negligibly small. Thus, the word line driver WDDR of the SRAM circuit shown in FIG. 19 exhibits a reduced leakage current.

Although the word line driver WDDR has been described as being made up of an inverter circuit, it may be a NAND or NOR circuit. Such an arrangement also allows a reduction in the leakage current of the driver by using a double gate transistor(s).

Figure 21:
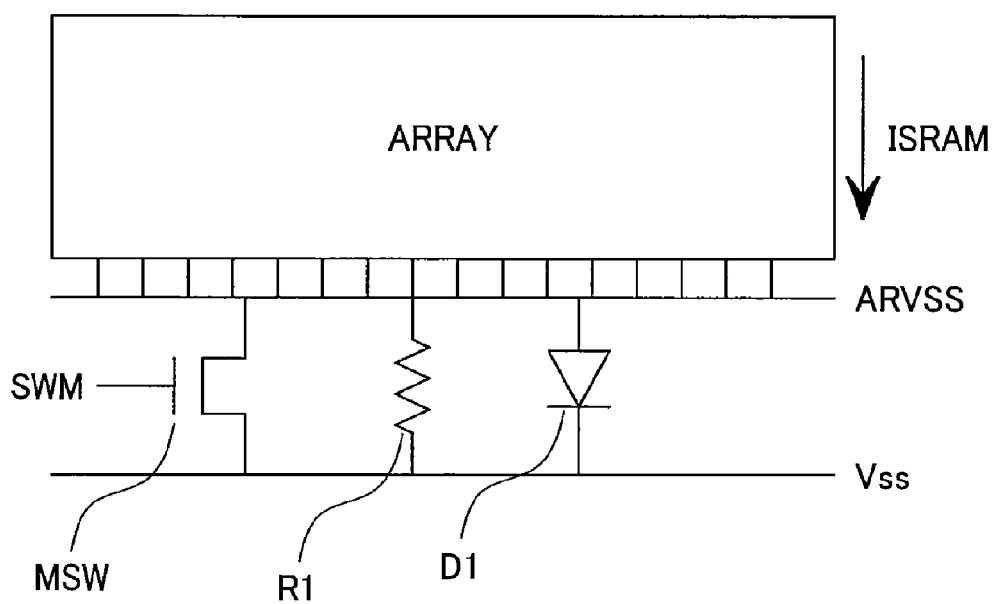
FIG. 21 is a schematic diagram showing a conventional circuit for reducing the leakage current of SRAM memory cells.

FIG. 21 shows a conventional circuit for reducing the leakage current of memory cells. Referring to the figure, symbol ARRAY denotes a memory cell array made up of a plurality of SRAM memory cells arranged in an array; ARVSS, a memory cell source line to which are connected the source nodes of the drive transistors of the memory cells; MSW, a transistor functioning as a power switch; R1, a resistance; D1, a diode; SWM, a signal for controlling the power switch MSW; and ISRAM, a leakage current flowing through the memory cell array ARRAY.

Figure 22:
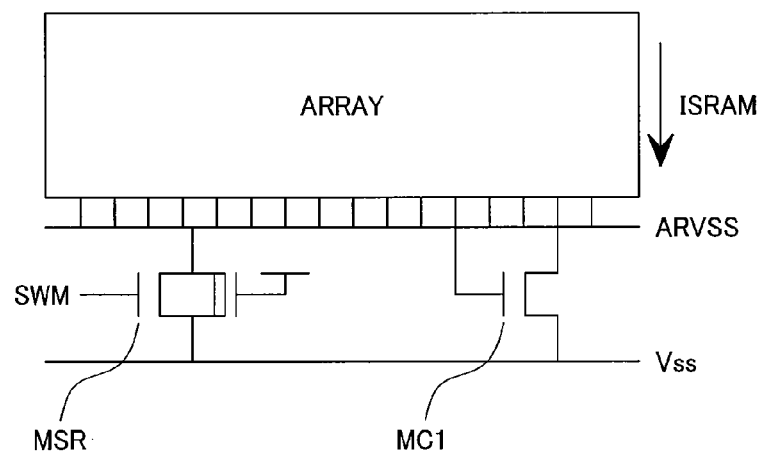
FIG. 22 is a schematic diagram showing a circuit for reducing the leakage current of SRAM memory cells according to the seventh embodiment.

FIG. 22 shows a circuit for reducing the leakage current of memory cells according to the present embodiment. Referring to the figure, symbol ARRAY denotes a memory cell array made up of a plurality of SRAM memory cells arranged in an array; ARVSS, a memory cell source line to which are connected the source nodes of the drive transistors of the memory cells; MSR, a double gate transistor functioning as both a power switch and a resistive element; MC1, a transistor functioning as a diode; SWN, a signal for controlling the power switch; and ISRAM, a leakage current flowing through the memory cell array ARRAY.

Figure 23:
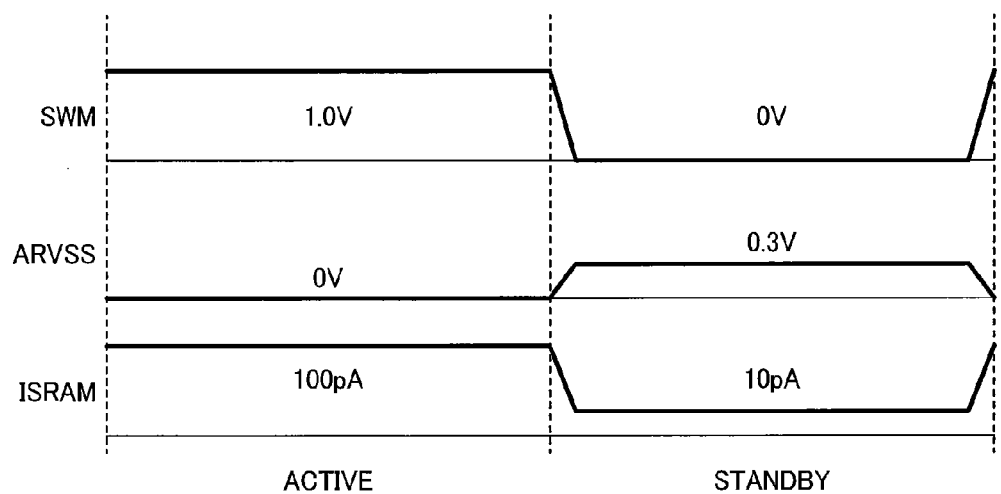
FIG. 23 is a diagram showing the relationships between voltages and currents in the circuit for reducing SRAM memory cells according to the seventh embodiment.

The waveform diagram shown in FIG. 23 shows the operation of the circuits shown in FIGS. 21 and 22. The circuit shown in FIG. 22 differs from the conventional circuit shown in FIG. 22 in that the power switch MSW and the resistance R1 shown in FIG. 21 are replaced by the single double gate transistor MSR shown in FIG. 22. In the circuit shown in FIG. 22, when the power switch (that is, the double gate transistor MSR) is turned on, both the first and second gates of the double gate transistor MSR are turned on, allowing a large current to pass, as compared to when a common single gate transistor is used as the power switch MSW or only the first gate of the double gate transistor is turned on. That is, this circuit allows a higher current to flow from the memory cells. This means that inserting this power switch, that is, the double gate transistor (between the memory cell array and ground potential line Vss) does not lead to as much reduction in the current (flowing from the memory cell array) as inserting a conventional power switch. Therefore, the above power switch configuration has an advantage over conventional power switch configurations. Furthermore, the resistance R1 shown in FIG. 21 can be eliminated (as shown in FIG. 22), since the second gate of the double gate transistor functions to provide desired resistivity, resulting in a reduction in the chip area. Thus, the circuit configuration shown in FIG. 22 allows a reduction in the leakage current of the memory cells while preventing an increase in the chip area.

FIG. 23 shows the leakage current ISRAM and the voltages of the memory cell source line ARVSS and the power switch control signal SWM in the circuit shown in FIG. 21. When the (memory) circuit is operating (that is, when it is in its active state), the power switch MSW is turned on and hence the voltage on the memory cell source line ARVSS is 0 V, since the control signal SWM for controlling the power switch MSW is at a high level. In this state, there is no reduction in the leakage current of the memory cells. On the other hand, when the (memory) circuit is not operating (or when it is in its standby state), the power switch MSW is turned off, since the control signal SWM for controlling the power switch MSW is at a low level. In this state, the voltage on the memory cell source line ARVSS is determined by the resistance R1, the diode D1, and the leakage current from the memory cells and is typically approximately 0.3 V. An increase in the voltage of the memory cell source line ARVSS results in a reduction in the voltage applied to the memory cells and hence a reduction in the gate leakage current flowing through the transistors constituting the memory cells. The gate leakage current is typically reduced by approximately one order of magnitude.

Furthermore, an increase in the voltage of the memory cell source line ARVSS also results in a reverse back-gate bias being applied to the n-channel transistors constituting the memory cells, thereby significantly reducing the leakage current of these transistors. Due to these effects, the leakage current ISRAM of the memory cells is reduced by a factor of approximately 10, as compared to when the (memory) circuit is operating. The resistance R1 may be a resistive element. However, in the case of an SRAM circuit mounted on an SoC, the on-resistance of a transistor is used instead of a resistive element in order to reduce process cost. Such a transistor has a large gate length so that its on-resistance matches the memory cell leakage current. For example, a transistor having a gate length of approximately 10 μm is used for a 64 kbit memory array produced by a 90 nm low-power process. If the memory array size is reduced, the resistance value must be increased since a reduction in the memory array size results in a reduction in the leakage current. However, a transistor having a large gate length occupies a large space, resulting in increased memory module area.

Figure 24:
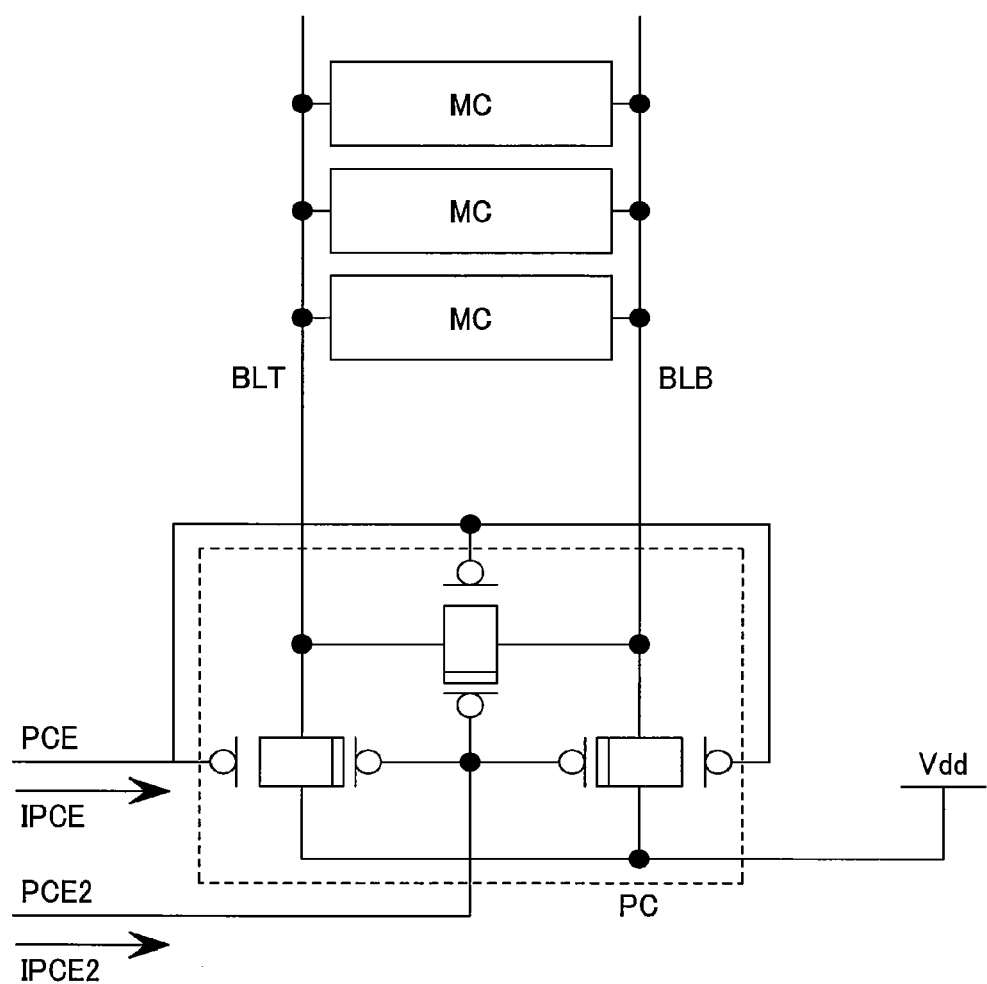
FIG. 24 is a schematic diagram showing a circuit for reducing the leakage current of a precharge circuit for SRAM according to the seventh embodiment.

FIG. 24 is a circuit diagram of a circuit for precharging bit lines according to the present embodiment. Referring to the figure, symbol MC denotes memory cells; PCE and PCE2, precharge signals, which are set at a low level when the bit lines are precharged; BLT and BLB, the bit lines; PC, the circuit for precharging the bit lines, which is made up of p-channel double gate transistors connected to one another; IPCE, the gate leakage current flowing through the transistor gate to which the precharge signal PCE is applied; and IPCE2, the gate leakage current flowing through the transistor gate to which the precharge signal PCE2 is applied.

Figure 25:
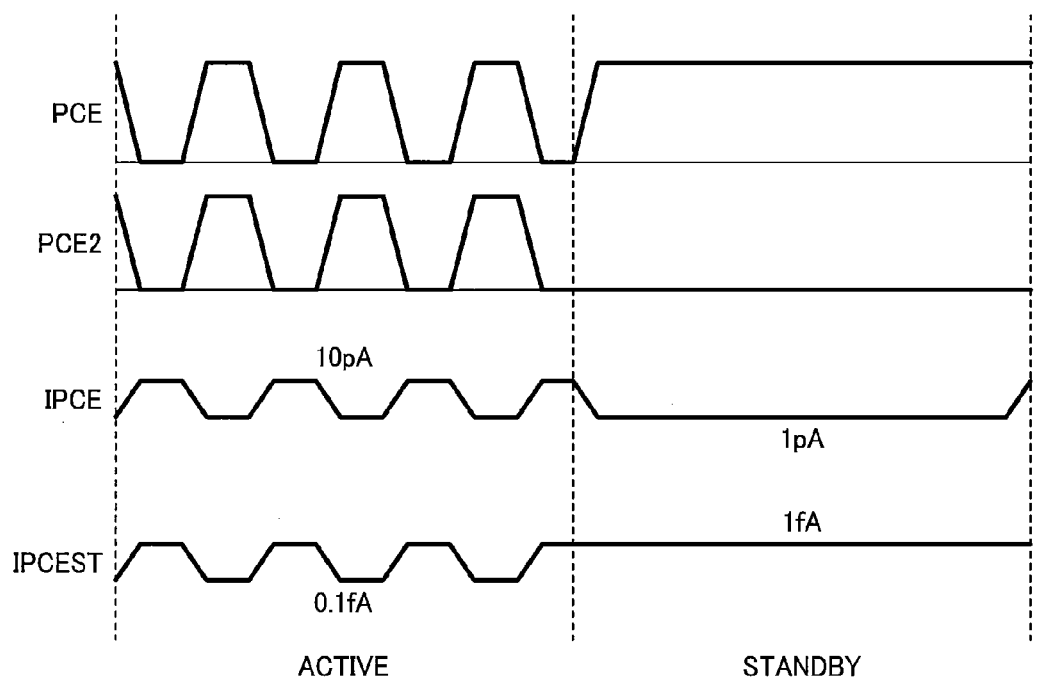
FIG. 25 is a diagram showing the relationships between voltages and currents in the leakage current reduction circuit for the SRAM precharge circuit according to the seventh embodiment.
Figure 26:
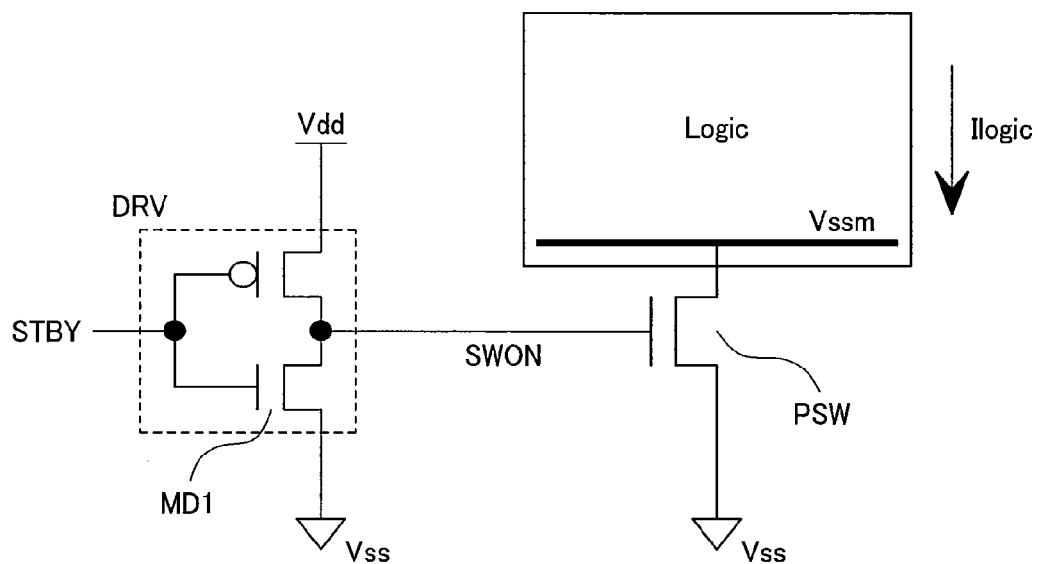
FIG. 26 is a schematic diagram showing a circuit block and conventional leakage current reduction circuitry therefor.
Figure 27:
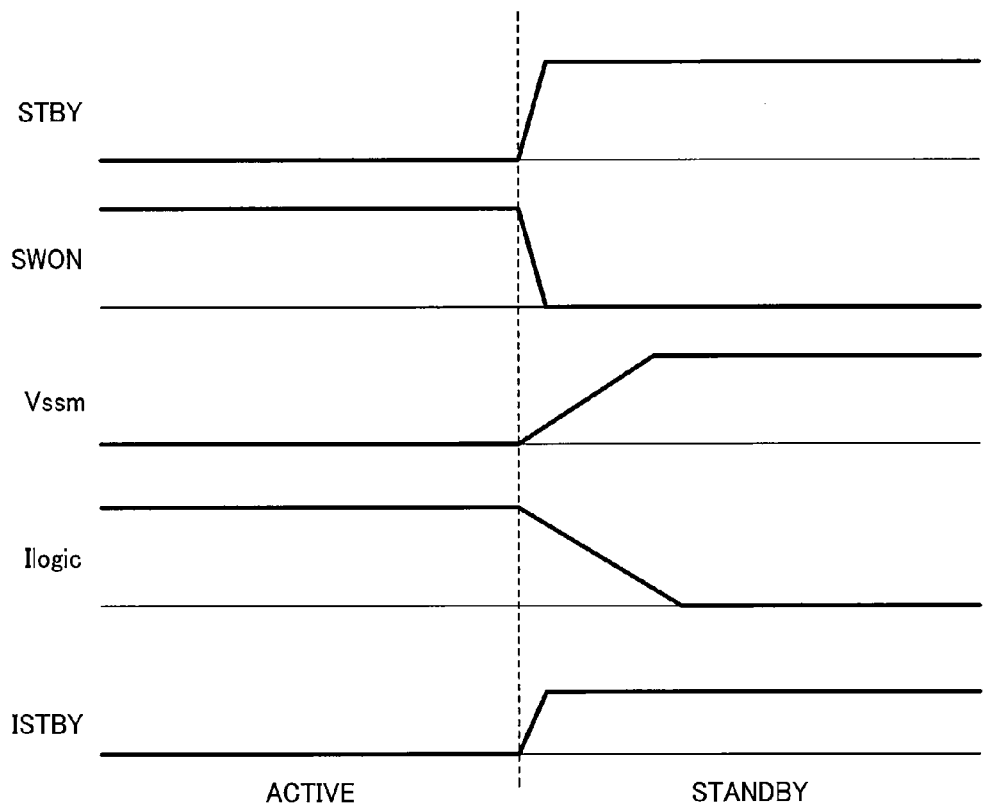
FIG. 27 is a diagram showing the relationships between voltages in the circuit block and in the conventional leakage current reduction circuitry therefor.

FIG. 25 shows gate voltages and currents in the circuit shown in FIG. 24. When the (memory) circuit is operating (that is, when it is in its active state), the precharge signals PCE and PCE2 repeatedly switch between high and low levels to repeat precharge of the bit lines. When the (memory) circuit is not operating (that is, when it is in its standby state), the bit lines are kept precharged. At that time, the first gates of the double gate transistors constituting the precharge circuit PC are turned off, and only the second gates of these double gate transistors are turned on to precharge the bit lines. (The reason for turning on only the second gates is that the gate leakage current of the first gates is large and that of the second gates is small since the insulating films for the second gates have a large thickness.) This reduces the leakage current of the first gates, resulting in a reduction in the total leakage current. Thus, the bit line precharge circuit shown in FIG. 24 exhibits a reduced leakage current.

Thus, the present embodiment provides an SRAM circuit that exhibits a reduced leakage current when it is not operating, thereby delivering enhanced performance.

Eighth Embodiment

Figure 28:
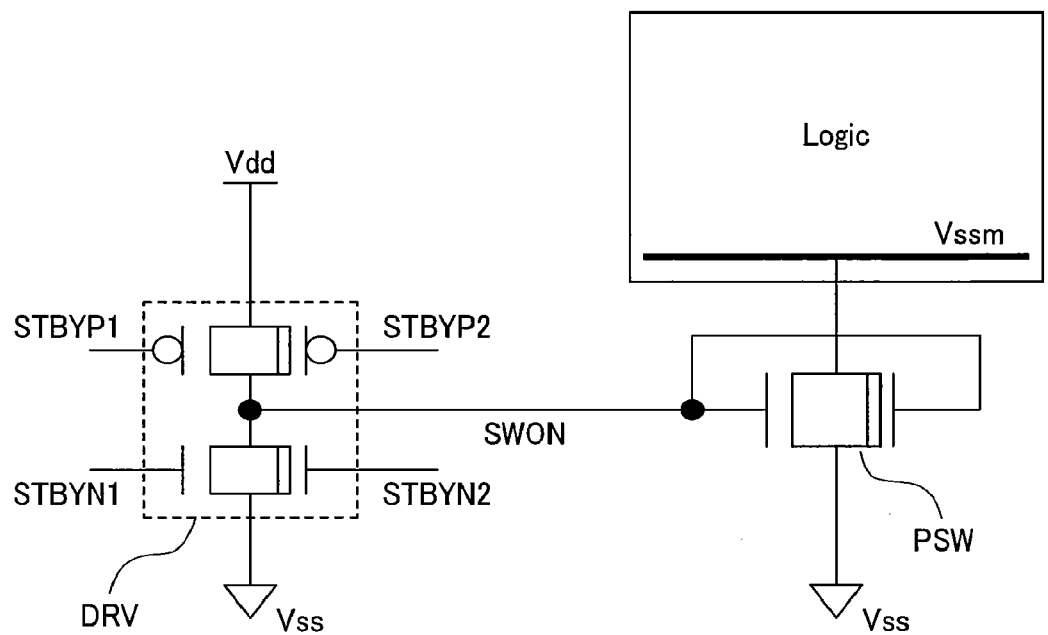
FIG. 28 is a schematic diagram showing a circuit block and leakage current reduction circuitry therefor according to an eighth embodiment of the present invention.

FIG. 28 is a circuit diagram of leakage current reduction circuitry according to an eighth embodiment of the present invention. Referring to the figure, symbol Logic denotes an integrated circuit block including many circuits; Vssm, a ground potential line within the circuit block Logic; PSW, a power switch made up of a double gate transistor and used to cut off power supply to the circuit block Logic; SWON, a signal for controlling the power switch PSW; DRV, a drive circuit for generating the control signal SWON (or driving the power switch PSW); STBYN1, a signal for controlling the first gate of the n-channel double gate transistor in the drive circuit DRV for generating the control signal SWON; STBYN2, a signal for controlling the second gate of the n-channel double gate transistor in the drive circuit DRV for generating the control signal SWON; STBYP1, a signal for controlling the first gate of the p-channel double gate transistor in the drive circuit DRV for generating the control signal SWON; and STBYP2, a signal for controlling the second gate of the p-channel double gate transistor in the drive circuit DRV for generating the control signal SWON.

Figure 29:
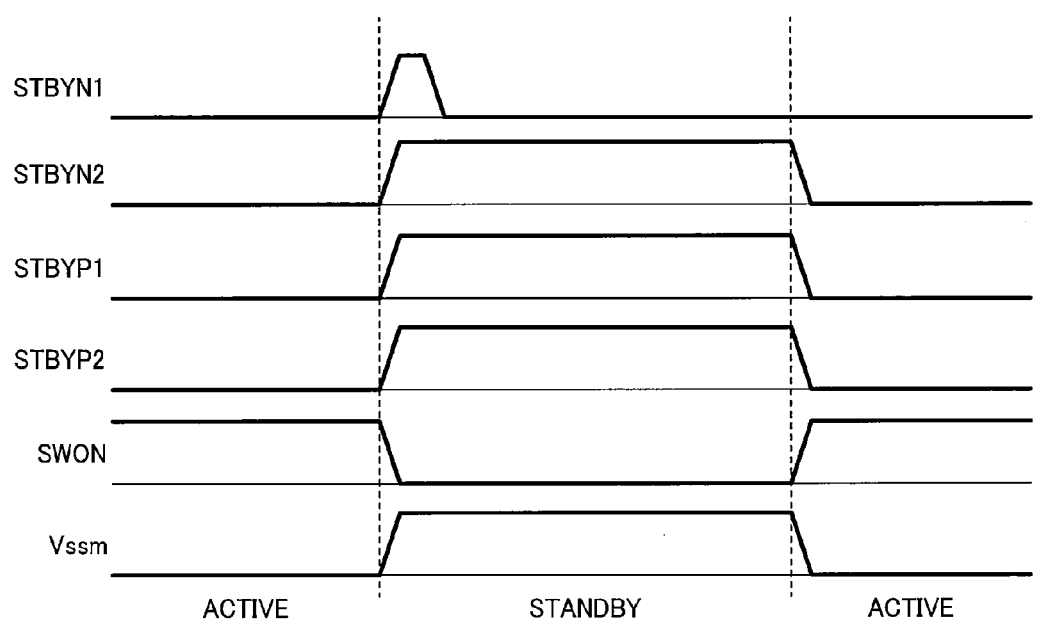
FIG. 29 is a diagram showing the relationships between voltages in the circuit block and in the leakage current reduction circuitry therefor according to the eighth embodiment.

FIG. 29 shows changes in node (or signal) voltages in the circuitry shown in FIG. 28. When the circuit block Logic is in the active state, the control signals STBYP1 and STBYP2 for controlling the p-channel double gate transistor in the drive circuit DRV (for generating the power switch control signal SWON) are at a low level and hence the p-channel transistor is turned on, setting the control signal SWON to a high level. As a result, the power switch PSW is turned on, setting the ground potential line Vssm to ground potential Vss so as to allow the circuit block Logic to operate properly.

In this circuitry, when the power switch PSW is turned on, both the first and second gates of the double gate transistor constituting the power switch PSW are turned on, allowing a large current to pass, as compared to when a common single gate transistor is used as the power switch PSW or only the first gate of the double gate transistor is turned on. That is, this circuitry allows a larger current to flow from the circuit block Logic. Therefore, inserting the above power switch (between the circuit block Logic and the ground potential line Vss) does not lead to as much reduction in the current (flowing from the circuit block Logic) as inserting a conventional power switch. Therefore, the above power switch configuration has an advantage over conventional power switch configurations.

When the circuit block Logic has switched from the active state to the standby state, the voltage of the control signal STBYN1 is set to a high level for a predetermined period of time, turning on the first gate of the n-channel double gate transistor in the drive circuit DRV. (At that time, the second gate of the n-channel double gate transistor is also turned on.) As a result, the voltage of the control signal SWON rapidly falls to a low level. At the same time, the control signals STBYP1 and STBYP2 for controlling the gate electrodes of the p-channel double gate transistor in the drive circuit DRV are set to a high level, preventing a charge current from flowing through the gates of the power switch PSW.

As a result, the power switch PSW is turned off and hence the potential of the ground potential line Vssm of the circuit block Logic rises, drastically reducing the leakage current of the circuit block Logic. When the circuit block Logic is in the standby state, the voltage of the control signal STBYN1 is normally at a low level (except for the above predetermined period of time), thereby reducing the gate leakage current flowing from the first gate of the n-channel double gate transistor in the drive circuit DRV. Further, since the second gate of the n-channel double gate transistor is turned on, the voltage of the control signal SWON for controlling the power switch PSW is maintained at a low level, preventing the power switch PSW from turning on.

Thus, the present embodiment allows a reduction in the leakage currents of both a circuit block and a leakage current reduction circuit therefor that uses a simple power switch to reduce the leakage current of the circuit block. The present embodiment also allows the circuit block (or logic circuit) to be have enhanced performance.

Ninth Embodiment

Figure 30:
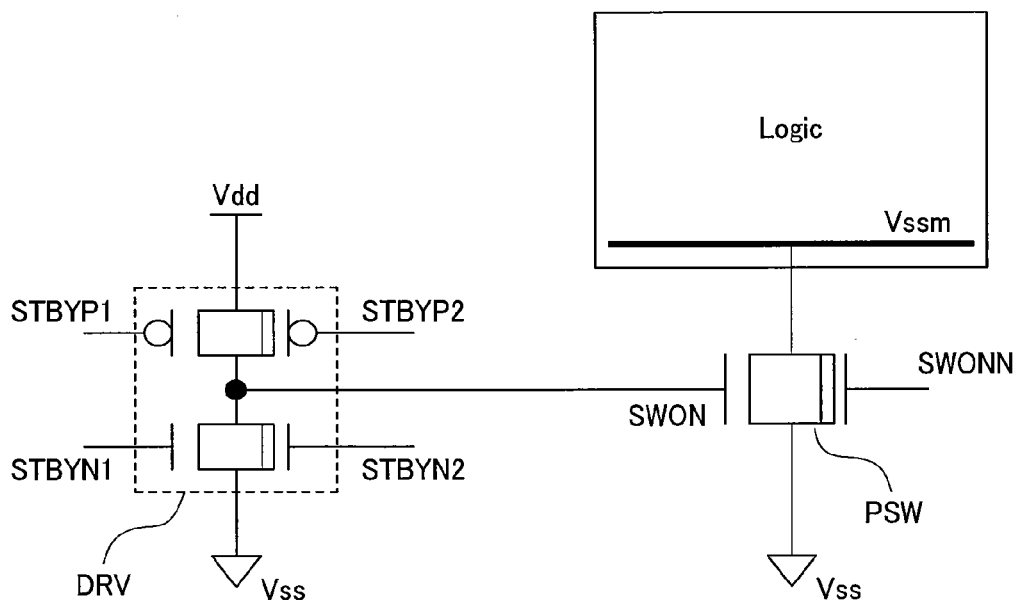
FIG. 30 is a schematic diagram showing a circuit block and leakage current reduction circuitry therefor according to a ninth embodiment of the present invention.

FIG. 30 is a circuit diagram of leakage current reduction circuitry according to a ninth embodiment of the present invention. The circuitry shown in FIG. 30 differs from that shown in FIG. 28 in that the second gate of the power switch PSW is controlled by a signal SWONN instead of the control signal SWON, which allows the second gate to be controlled independently of the first gate.

Figure 31:
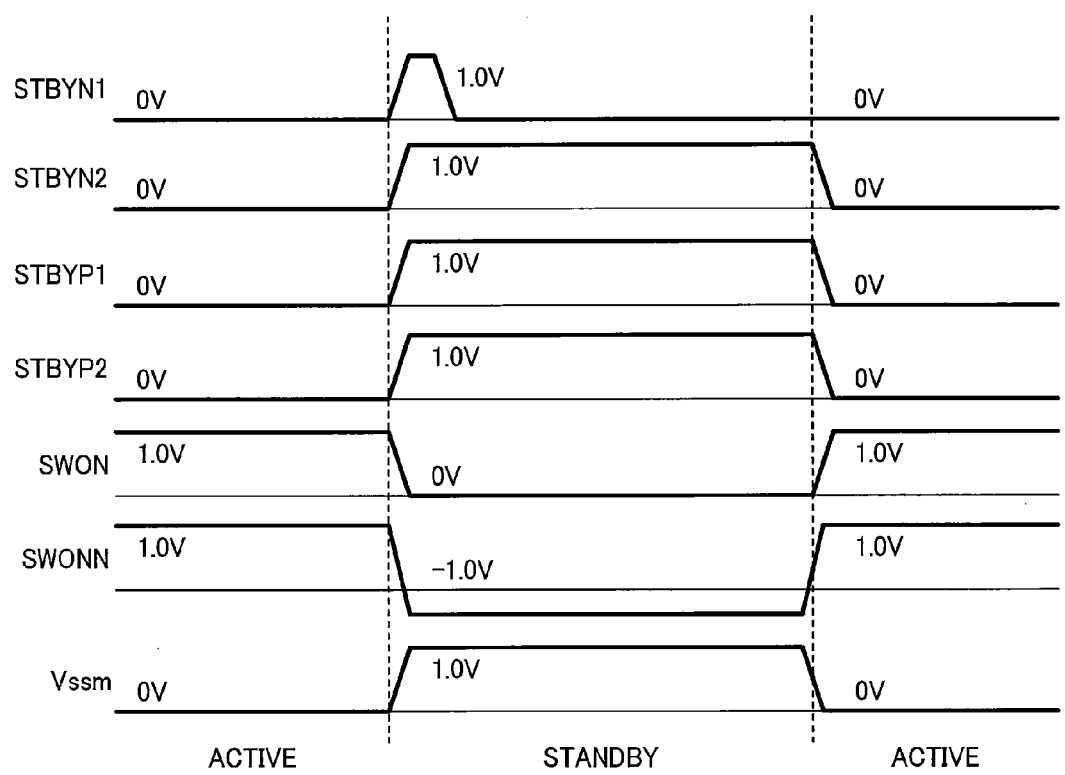
FIG. 31 is a diagram showing the relationships between voltages in the circuit block and in the leakage current reduction circuitry therefor according to the ninth embodiment.

FIG. 31 shows changes in node (or signal) voltages in the circuitry shown in FIG. 30. Specifically, FIG. 31 shows the voltage of the control signal SWONN in addition to the signal and line voltages shown in FIG. 29. When the circuit block Logic is not operating (that is, when it is in its standby state), the voltage of the control signal SWONN is set to be negative. (Applying a negative voltage to the second gate of a double gate transistor reduces the leakage current of the transistor, as indicated by the current characteristics shown in FIG. 5.) As a result, the leakage current flowing through the power switch PSW is small, as compared to the signal voltage state shown in FIG. 29. This means that the leakage current flowing from the circuit block Logic is further reduced, as compared to the circuitry shown in FIG. 28. It should be noted that applying a low voltage (approximately 1.0 V) to the second gate of the power switch PSW does not cause a reliability problem, since the gate oxide film for the second gate has a large thickness (approximately 10 nm).

Thus, the present embodiment allows a reduction in the leakage currents of both a circuit block (or logic circuit) and a leakage current reduction circuit therefor that uses a power switch to reduce the leakage current of the circuit block. The present embodiment also enhances the performance of the circuit block (or logic circuit) by optimizing the control of the power switch.

Tenth Embodiment

Figure 32:
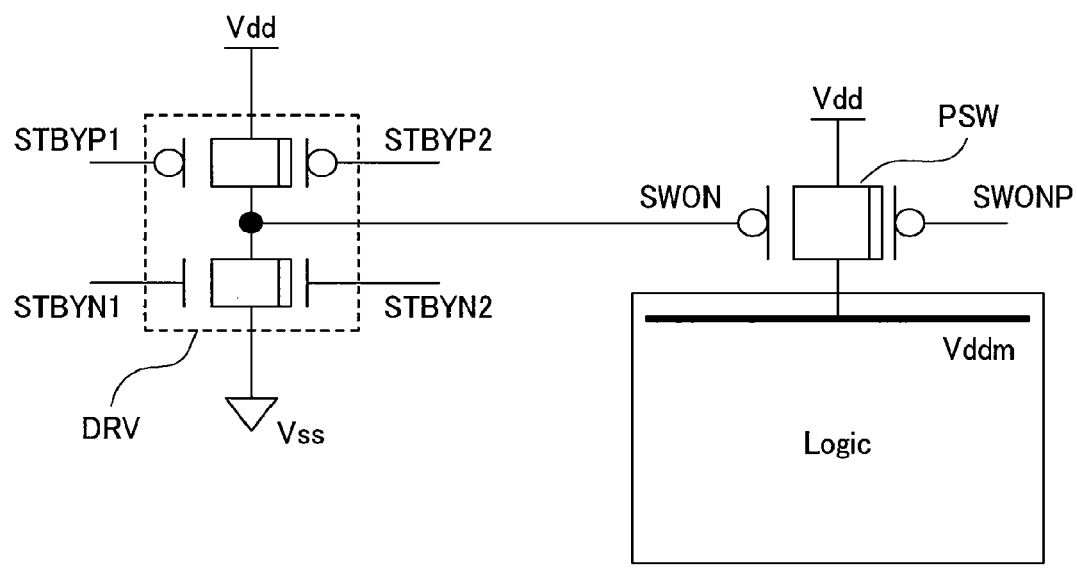
FIG. 32 is a schematic diagram showing a circuit block and leakage current reduction circuitry therefor according to a tenth embodiment of the present invention.

FIG. 32 is a circuit diagram of leakage current reduction circuitry according to a tenth embodiment of the present invention. The circuitry shown in FIG. 32 differs from that shown in FIG. 13 in that the power switch PSW is made up of a double gate transistor. The first gate of the double gate transistor is controlled by the control signal SWON, as in the circuitry shown in FIG. 13, and the second gate of the double gate transistor is controlled by a different control signal SWONP, which allows the second gate to be controlled independently of the first gate.

Figure 33:
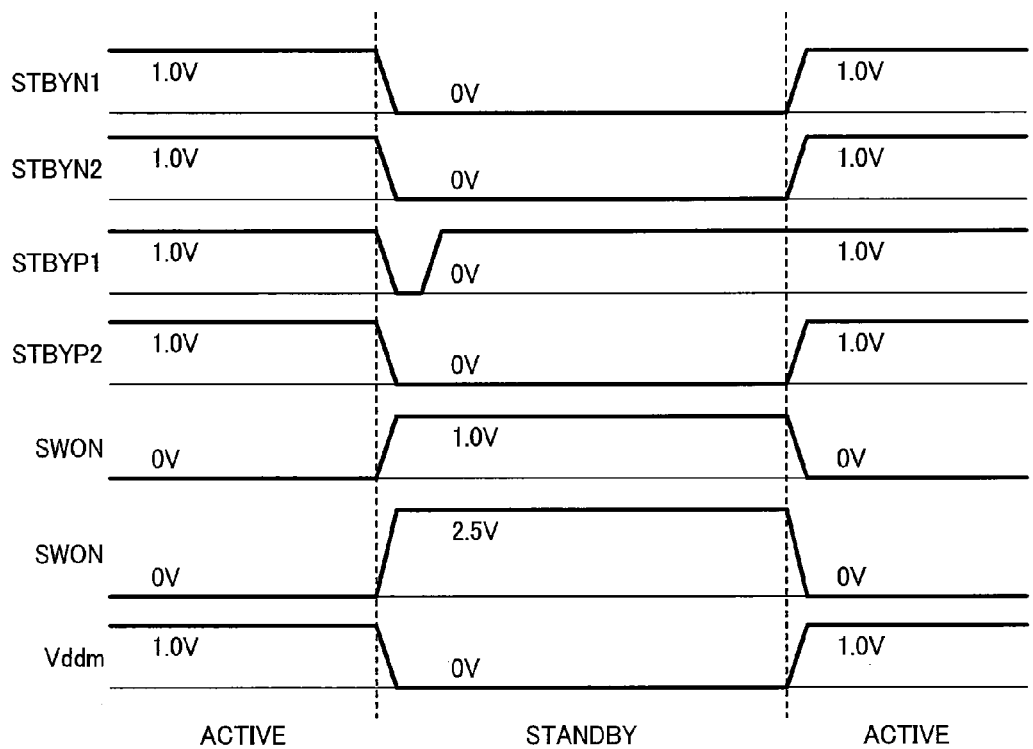
FIG. 33 is a diagram showing the relationships between voltages in the circuit block and in the leakage current reduction circuitry therefor according to the tenth embodiment.

FIG. 33 shows changes in node (or signal) voltages in the circuitry shown in FIG. 32. Specifically, FIG. 33 shows the voltage of the control signal SWONP in addition to the signal and line voltages shown in FIG. 14. When the circuit block Logic is not operating (that is, when it is in its standby state), the voltage of the control signal SWONP is set to 2.5 V, which is higher than the power supply voltage (1.0 V). (Applying a higher voltage than the power supply voltage to the second gate of a p-channel double gate transistor reduces the leakage current of the transistor, as can be seen by translating the current characteristics of an n-channel double gate transistor shown in FIG. 5 into those of a p-channel double gate transistor.)

As a result, the leakage current flowing through the power switch PSW is small, as compared to the signal voltage state shown in FIG. 14. This means that the leakage current flowing from the circuit block Logic is further reduced, as compared to the circuitry shown in FIG. 13. It should be noted that applying a low voltage (approximately 2.5 V) to the second gate of the power switch PSW does not cause a reliability problem, since the gate oxide film for the second gate has a large thickness (approximately 10 nm). It should be further noted that the input/output circuits in LSIs also use a voltage of 2.5 V. This means that the above arrangement does not require a special power supply circuit such as a booster circuit. Therefore, the present embodiment can be applied to LSIs without an increase in the chip area and in the power consumption.

It should be noted that the voltage applied to the second gate of the power switch PSW need not necessarily be 2.5 V. Application of a voltage higher than 1.0 V will provide the same effect. Use of a different voltage than that (2.5 V) of the input/output circuit requires a special power supply circuit such as a booster circuit. However, such an arrangement also can produce the leakage current reduction effect as described above. Further, applying a higher voltage than 2.5 V to the second gate results in a further reduction in the leakage current.

Thus, the present embodiment allows a reduction in the leakage currents of both a circuit block (or logic circuit) and a leakage current reduction circuit therefor that uses a power switch to reduce the leakage current of the circuit block. The present embodiment also enhances the performance of the logic circuit (or logic circuit) by optimizing the control of the power switch.

Eleventh Embodiment

Figure 34:
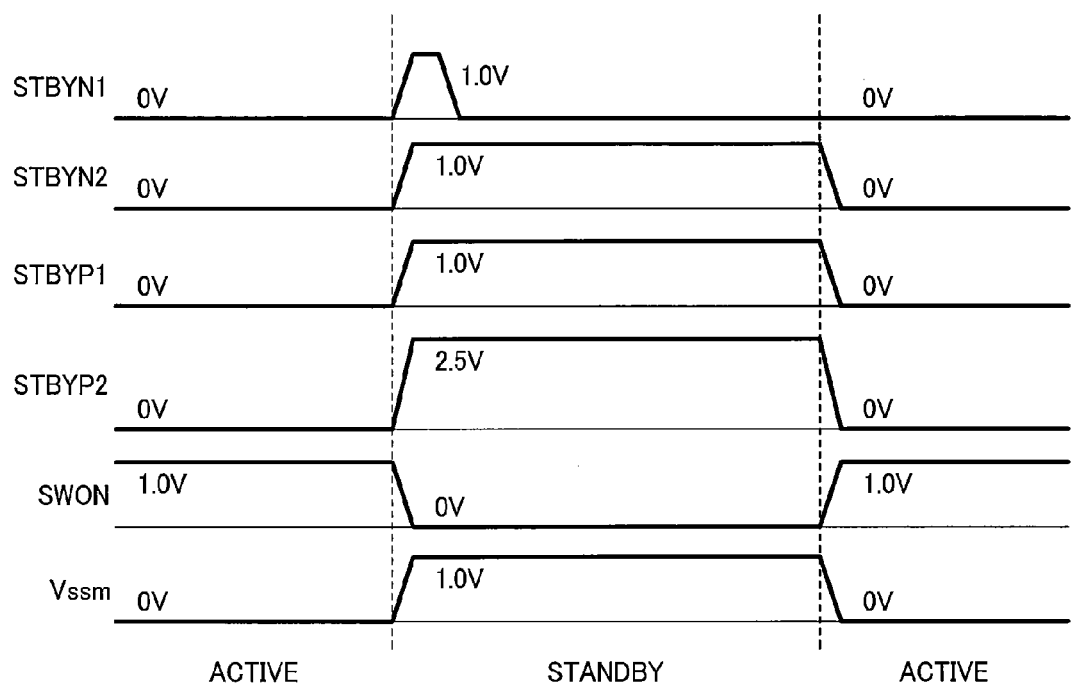
FIG. 34 is a diagram showing the relationships between voltages in a circuit block and in a leakage current reduction circuitry therefor according to an eleventh embodiment of the present invention.

FIG. 34 shows a leakage current reduction method using the circuitry shown in FIG. 11. This leakage current reduction method differs from that of the fourth embodiment, as described below. When the circuit block Logic is operating (that is, when it is in its active state), the operation of the circuitry is controlled in the same manner as in the fourth embodiment. On the other hand, when the circuit block Logic is not operating (that is, when it is in its standby state), the voltage of the control signal STBYP2 is set to 2.5 V, which is higher than the power supply voltage (1.0 V). (According to the fourth embodiment, the voltage of the control signal STBYP2 is set to 1.0 V.) When the circuit block Logic is not operating, a subthreshold leakage current flows between the source electrode and the drain electrode of the p-channel double gate transistor in the drive circuit DRV since the voltage of the control signal SWON is 0 V and the power supply voltage Vdd is 1.0 V. It should be noted that applying a higher voltage than 1.0 V to the second gate of the p-channel double gate transistor reduces the subthreshold leakage current of the transistor, as can be seen by translating the current characteristics of an n-channel double gate transistor shown in FIG. 5 into those of a p-channel double gate transistor. This allows a large reduction in the leakage current of the drive circuit DRV.

Thus, the present embodiment allows a reduction in the leakage currents of both a circuit block and a leakage current reduction circuit therefor that uses a power switch to reduce the leakage current of the circuit block. The present embodiment provides higher leakage current reduction effect than the fourth embodiment by increasing the voltage applied to the second gate of the p-channel double gate transistor in the leakage current reduction circuit (or drive circuit).

Twelfth Embodiment

Figure 35:
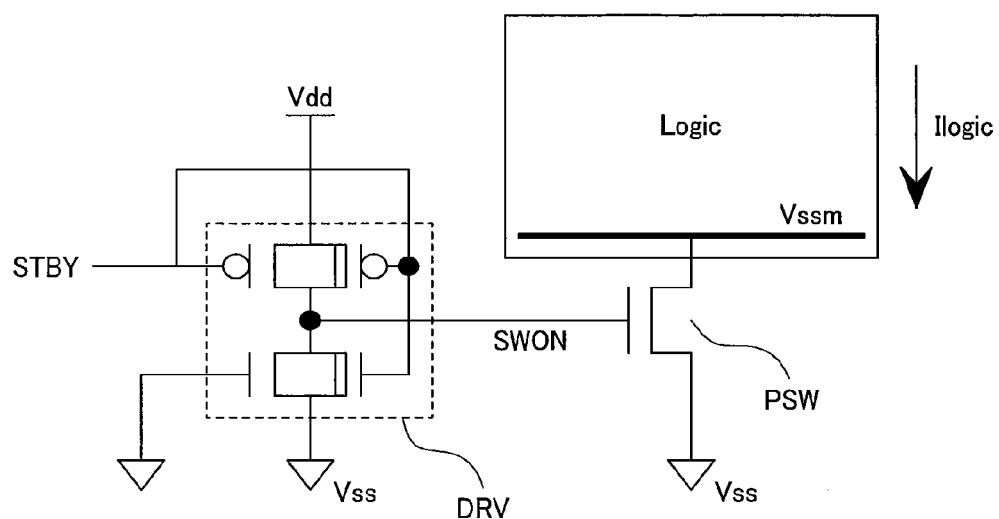
FIG. 35 is a schematic diagram showing a circuit block and leakage current reduction circuitry therefor according to a twelfth embodiment of the present invention.

FIG. 35 is a circuit diagram of leakage current reduction circuitry according to a twelfth embodiment of the present invention. Referring to the figure, symbol Logic denotes an integrated circuit block including many circuits; Vssm, a ground potential line within the circuit block Logic; STBY, a standby signal, which is set at a high level when the circuit block Logic is in its standby state; PSW, a power switch used to cut off power supply to the circuit block Logic; SWON, a signal for controlling the power switch PSW; DRV, a drive circuit for generating the control signal SWON (or driving the power switch PSW); and Ilogic, a current flowing through the current block Logic.

Figure 36:
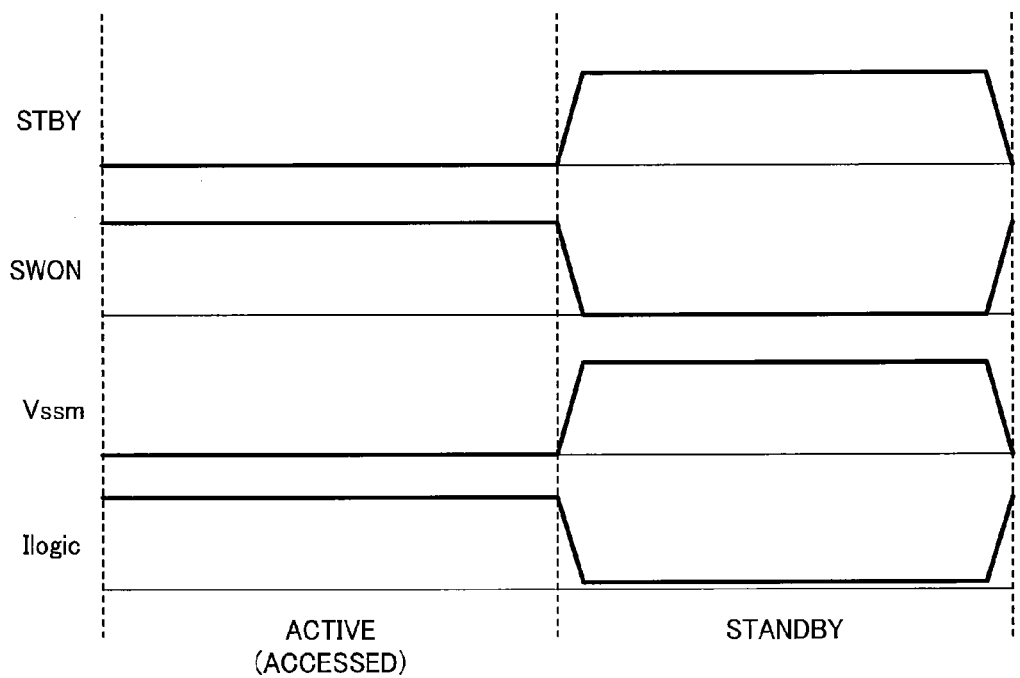
FIG. 36 is a diagram showing the relationships between voltages and currents in the circuit block and in the leakage current reduction circuitry therefor according to the twelfth embodiment.

FIG. 36 shows changes in node (or signal) voltages and currents in the circuitry shown in FIG. 35. When the circuit block Logic is in the active state, the power switch PSW is turned on and hence the ground potential line Vssm is set to ground potential Vss, allowing the circuit block Logic to operate properly. At that time, the control signal STBY (applied to the drive circuit DRV for generating the power switch control signal SWON) is set at a low level, which sets the control signal SWON to a high level. When the circuit block Logic has switched from the active state to the standby state, the standby signal STBY is set to a high level, turning on the second gate of the n-channel double gate transistor in the drive circuit DRV. As a result, the control signal SWON is set to a low level, turning off the power switch PSW. This results in an increase in the potential of the ground potential line Vssm of the circuit block Logic and hence a significant reduction in the leakage current Ilogic flowing through the circuit block Logic. This circuitry differs from the circuitry shown in FIG. 7 in that the first gate of the re-channel double gate transistor in the drive circuit DRV is always in an off state.

This results in a situation where it takes some time for the voltage of the control signal SWON to fall to a low level. However, this arrangement does not cause a significant problem, since the circuit block Logic is normally in the standby state when the control signal SWON is set to a low level. In some cases, the above circuit configuration has an advantage. Furthermore, there is no need to generate a signal for controlling the first gate, resulting in benefits such as reduced power consumption and reduced chip area. Further, it is possible to reduce the leakage current of the portion of the circuitry that generates signals.

Thus, the present embodiment allows a reduction in the leakage currents of both a circuit block and a leakage reduction circuit therefor that uses a power switch to reduce the leakage current of the circuit block.

As described above, the present embodiment allows a reduction in the leakage currents of both a circuit block and a leakage current reduction circuit that uses a power switch to reduce the leakage current of the circuit block. Further, the present embodiment also allows a reduction in the area of the leakage current reduction circuit (that controls the power supply to the circuit block) through simple control of the power switch.

Thirteenth Embodiment

Figure 37:
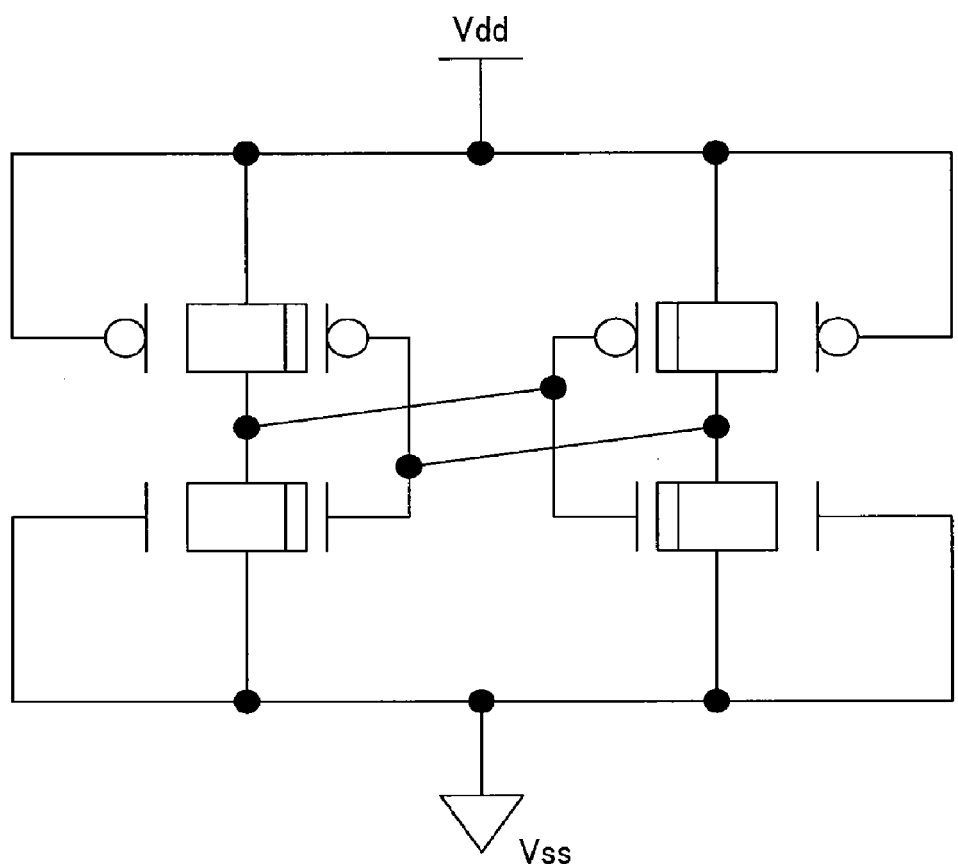
FIG. 37 is a circuit diagram of a memory device circuit having a reduced leakage current according to a thirteenth embodiment of the present invention.

FIG. 37 is a circuit diagram showing a memory device circuit exhibiting a reduced leakage current according to a thirteenth embodiment of the present invention. As shown in FIG. 37, this memory device includes interconnected inverters each made up of n-channel and p-channel double gate transistors. The first gate of each p-channel double gate transistor is connected to a power supply voltage line Vdd, and the first gate of each n-channel double gate transistor is connected to a ground potential line Vss. Therefore, these first gates are in an off state, resulting in a reduced leakage current. Further, the second gates of the double gate transistors in one inverter are connected to the input of the other inverter, and vice versa, allowing the memory device to store data. This arrangement allows a reduction in the leakage current of the memory device, since only the second gates of the p-channel and re-channel double gate transistors can be turned on.

Figure 38:
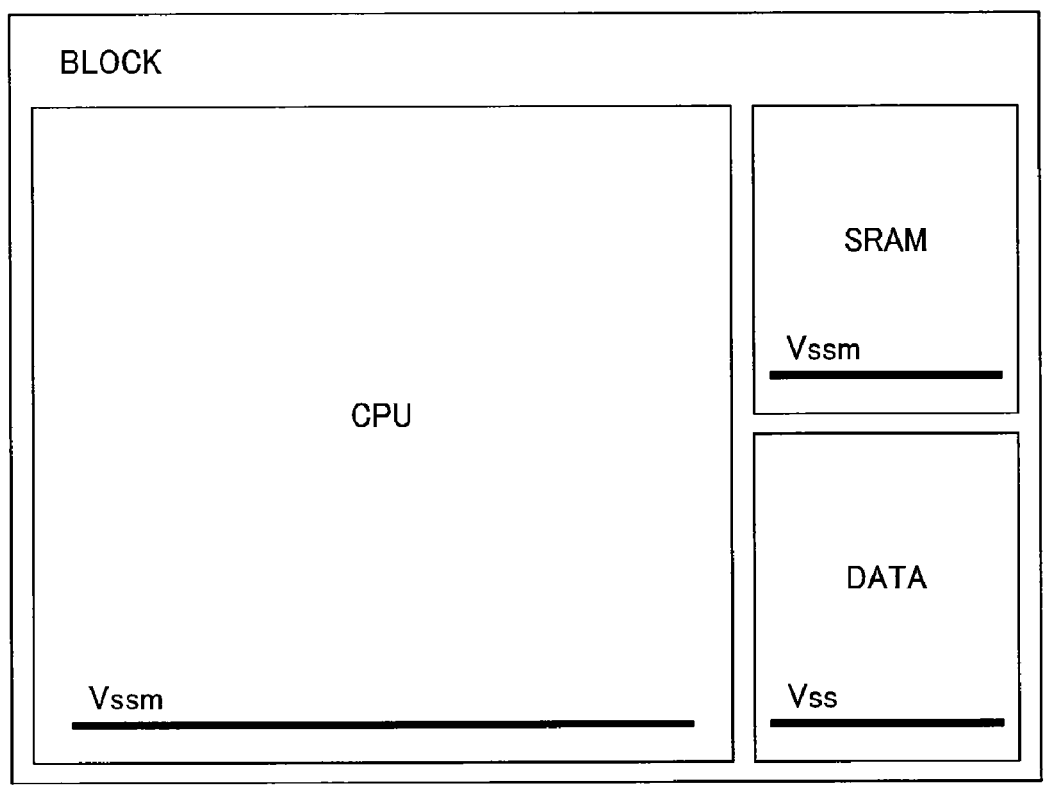
FIG. 38 is a block diagram showing a circuit block according to the thirteenth embodiment.

FIG. 38 is a block diagram showing a circuit block according to the present embodiment. This circuit block corresponds to a combination of the circuit blocks BLOCK1 and BLOCK2 shown in FIG. 17. Referring to FIG. 38, symbol BLOCK denotes the circuit block; CPU, a circuit module having a particular function; SRAM and DATA, modules for storing data; Vssm, ground potential lines that are disconnected from the power supply when the circuit block is not operating; and Vss, a ground potential line that is always connected to the power supply. The module SRAM is made up of conventional memory cells. Disconnecting the ground potential line Vssm of the module SRAM from the power supply reduces the leakage current of the module SRAM even though the data in the module is lost. The module DATA is made up of memory devices such as that shown in FIG. 37. The ground potential line Vss of this module is not disconnected from the power supply (as described above). However, the module DATA can retain data while exhibiting a reduced leakage current. When this circuit block is not operating, the necessary portions of the data stored in the module SRAM and in the flip-flops within the module CPU may be saved to the module DATA before disconnecting the ground potential lines Vssm from the power supply. With this, the circuit block BLOCK can retain data while exhibiting a reduced leakage current.

Thus, the present embodiment provides a memory device and a circuit block that exhibit a reduced leakage current.

Fourteenth Embodiment

Figure 39:
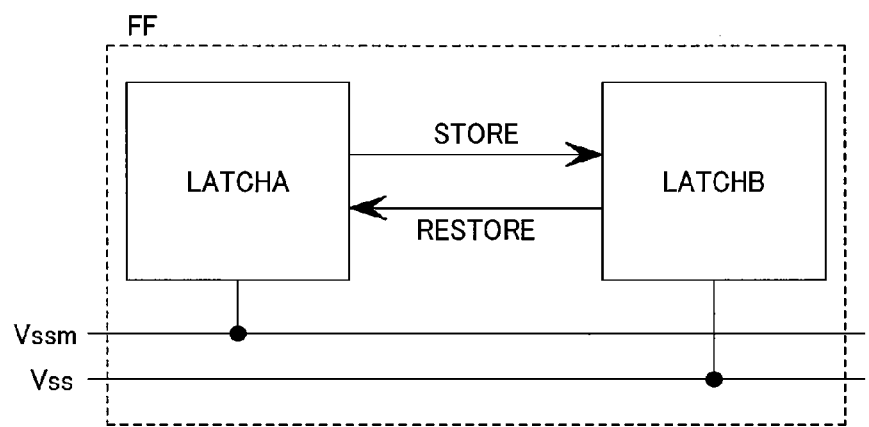
FIG. 39 is a block diagram showing a flip-flop circuit that can retain data while exhibiting a reduced leakage current according to a fourteenth embodiment of the present invention.

FIG. 39 is a block diagram showing a flip-flop circuit that can retain data while exhibiting a reduced leakage current according to a fourteenth embodiment of the present invention. Referring to the figure, symbol FF denotes a flip-flop circuit; LATCHA and LATCHB, latches for storing data; Vssm, a ground potential line that is disconnected from the power supply when the circuit is not operating; Vss, a ground potential line that is always connected to the power supply; STORE, a path through which data is transferred from the latch LATCHA to the latch LATCHB; and RESTORE, a path through which data is transferred from the latch LATCHB to LATCHA. The latch LATCHA is a conventional latch circuit, while the latch LATCHB is a latch circuit made up of a memory device such as that of the thirteenth embodiment. When this circuit is not operating, the data in the latch LATCHA may be transferred to the latch LATCHB through the path STORE and then the ground potential line Vssm may be disconnected from the power supply to reduce the leakage current of the latch LATCHA. Since the latch LATCHB is made up of a memory device having only a small leakage current, this flip-flop circuit exhibits a reduced leakage current.

When the flip-flop circuit is put into operation, the ground potential line Vssm is connected to the power supply to set the line Vssm to ground potential level (Vss) and the data in the latch LATCHB is returned to the latch LATCHA through the path RESTORE, allowing the circuit to operate as a conventional flip-flop.

Thus, the present embodiment provides a flip-flop circuit having a reduced leakage current.

Fifteenth Embodiment

Figure 40:
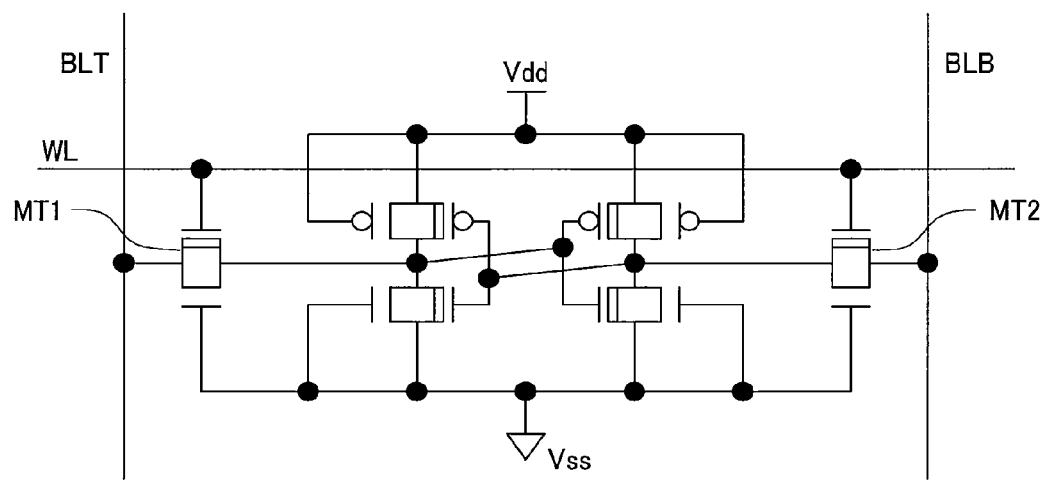
FIG. 40 is a circuit diagram of an SRAM memory cell that can retain data while exhibiting a reduced leakage current according to a fifteenth embodiment of the present invention.

FIG. 40 is a circuit diagram of an SRAM memory cell circuit that can retain data while exhibiting a reduced leakage current according to a fifteenth embodiment of the present invention. This SRAM memory cell circuit includes: a memory device such as that shown in FIG. 37; transfer transistors MT1 and MT2 used to access the memory device; bit lines BLT and BLB; and a word line WL. Data can be written to and read from the memory cell by selecting the word line WL, as in a conventional SRAM memory cell. The first gates of the double gate transistors in the memory cell are always set to an off state to reduce their leakage current, since the gate oxide films for these gates have a small thickness. The second gates of the double gate transistors constitute the memory device to store data.

Thus, the present embodiment provides an SRAM memory cell having a reduced leakage current.

Sixteenth Embodiment

Figure 41:
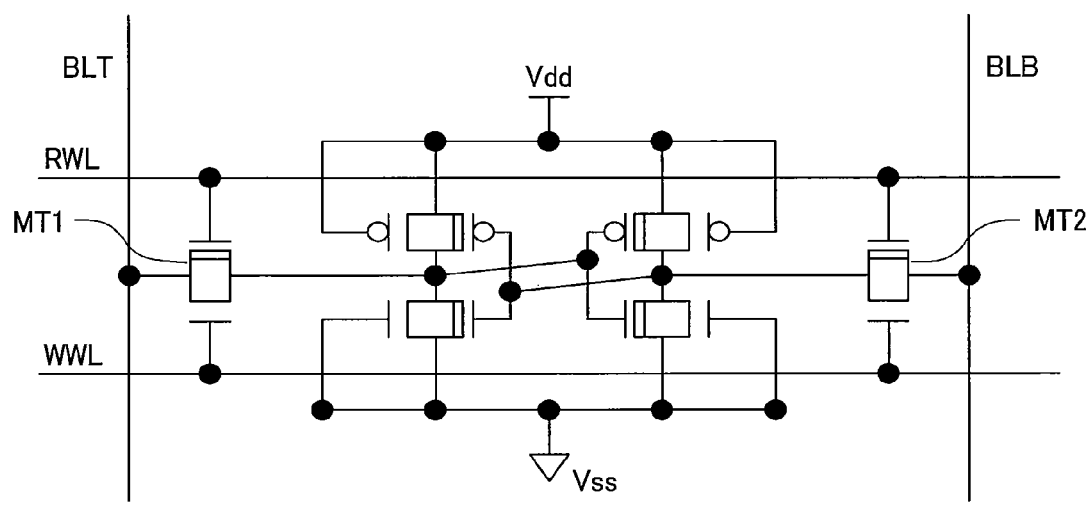
FIG. 41 is a circuit diagram of an SRAM memory cell that can retain data while exhibiting a reduced leakage current according to a sixteenth embodiment of the present invention.

FIG. 41 is a circuit diagram of an SRAM memory cell circuit that can retain data while exhibiting a reduced leakage current according to a sixteenth embodiment of the present invention. This SRAM memory cell circuit is similar to that shown in FIG. 40 except that it does not include the word line WL but instead includes a read word line RWL used to read from the cell and a write word line WWL used to write to the cell. The data in this memory cell is read by selecting the read word line RWL. The read data is output to a bit line. On the other hand, data is written to the memory cell by selecting the write word line WWL. The data to be written is supplied to the cell through a bit line and the first gate of the transfer transistor connected to the bit line. When data is written to the memory cell, the larger the current flowing through the transfer transistor, the more reliable the write operation. Therefore, the above memory cell configuration results in improved programming, or write, characteristics. When the memory cell is not accessed, the leakage current of the memory cell is small since the first gates of the double gate transistors in the memory cell are always in an off state. (The gate oxide films for these gates have a small thickness, as described above.)

Thus, the present embodiment provides an SRAM memory cell that has good programming, or write, characteristics and exhibits a reduced leakage current.

Seventeenth Embodiment

Figure 42:
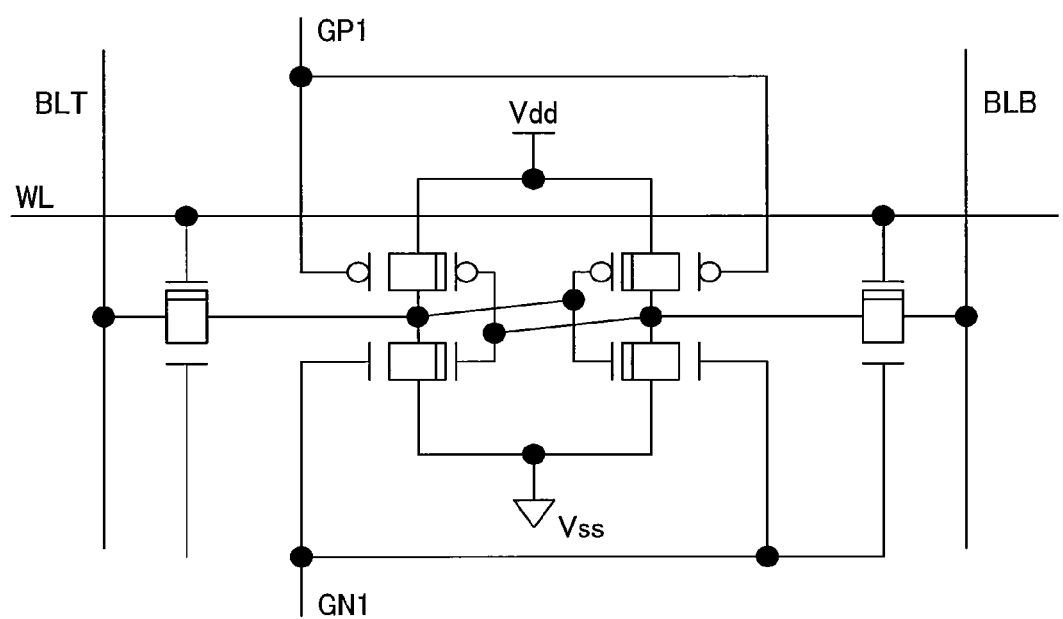
FIG. 42 is a circuit diagram of an SRAM memory cell that can retain data while exhibiting a reduced leakage current according to a seventeenth embodiment of the present invention.

FIG. 42 is a circuit diagram of an SRAM memory cell circuit that can retain data while exhibiting a reduced leakage current according to a seventeenth embodiment of the present invention. This SRAM memory cell circuit is similar to that shown in FIG. 40 except that the first gates of the p-channel transistors constituting the memory cell are connected to a line GP1 and those of the n-channel transistors constituting the memory cell are connected to a line GN1. This memory cell is accessed in the same manner as the memory cell shown in FIG. 40.

When the memory cell operates, a lower voltage than the power supply voltage (Vdd) is applied to the line GP1 and a higher voltage than the power supply voltage (Vss) is applied to the line GN1 to increase the on-current of the double gate transistors, as compared to the current characteristics shown in FIG. 5, thereby enhancing the read/write characteristics of the memory cell.

Further, when the memory cell does not operate, a higher voltage than the power supply voltage (Vdd) is applied to the line GP1 and a lower voltage than the power supply voltage (Vss) is applied to the line GN1 to reduce the off-current of the double gate transistors, as compared to the current characteristics shown in FIG. 5, thereby reducing the leakage current of these double gate transistors.

In the above example, the voltages of the first gates of the p-channel double gate transistors and the re-channel double gate transistors are changed from the values (Vdd and Vss, respectively) shown in FIG. 40 both when the memory cell is operating and when it is not operating. However, these voltages may be changed only when the memory cell is or is not operating. Further, the word line configuration of the sixteenth embodiment may be added to the above configuration to improve the programming, or write, characteristics.

Thus, the present embodiment provides a high-performance SRAM memory cell having a reduced leakage current.

Eighteenth Embodiment

Figure 43:
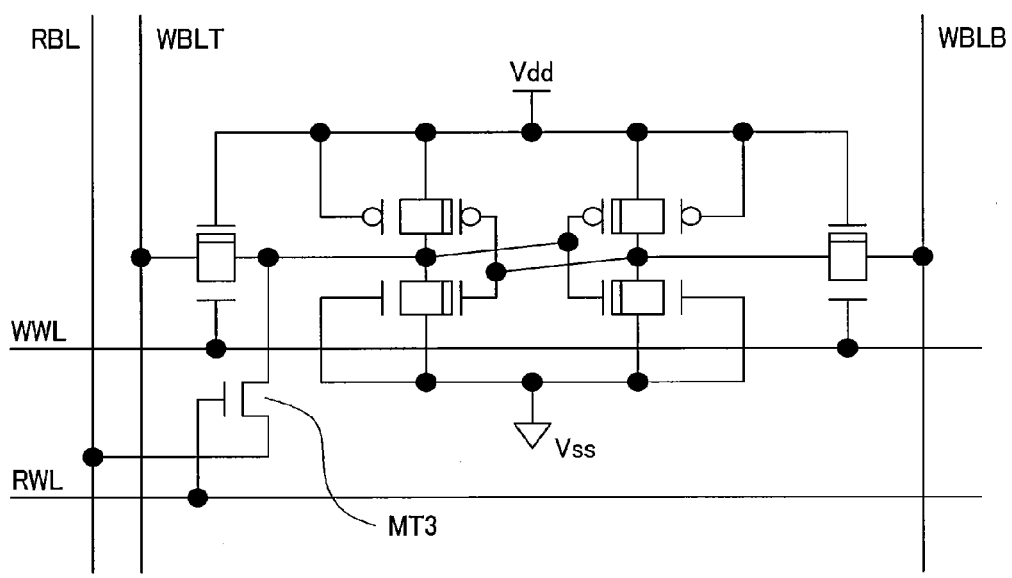
FIG. 43 is a circuit diagram of an SRAM memory cell that can retain data while exhibiting a reduced leakage current according to an eighteenth embodiment of the present invention.

FIG. 43 is a circuit diagram showing an SRAM memory cell circuit that can retain data while exhibiting a reduced leakage current according to an eighteenth embodiment of the present invention. This SRAM memory cell circuit is similar to that shown in FIG. 41 except that: it additionally includes a read bit line RBL and a transfer transistor MT3, the read bit line RBL being connected to the gate of the transfer transistor MT3; and the bit lines (BLT and BLB) shown in FIG. 41 are replaced by write bit lines WBLT and WBLB, respectively.

Data is written to this memory cell using the write word line WWL and the write bit lines WBLT and WBLB in the same manner as to the memory cell shown in FIG. 41. On the other hand, when data is read from the memory cell, the read word line is activated and thereby the data is output from the memory cell to the read bit line RBL through the transfer transistor MT3.

It should be noted that since the latch circuits in the memory cell circuits shown in FIGS. 41 and 43 are made up of the second gates of double gate transistors, their drive current is small. Therefore, in the case of the memory cell shown in FIG. 41, data might be damaged when it is read from the latch circuit. In the case of the memory cell of the present embodiment shown in FIG. 43, however, data is safely read from the latch circuit without damage, since no voltage is applied to the portion of the latch circuit that stores data.

Although the present embodiment has been described with reference to an SRAM memory cell circuit that includes only a single read bit line, the technique of the present embodiment may be applied to a memory cell circuit employing two read bit lines for complementary signals.

Thus, the present embodiment provides an SRAM memory cell that has enhanced read/write characteristics and exhibits a reduced leakage current.

The following are reference numerals used in the drawings of this specification.

1 . . . first gate electrode
2 . . . drain electrode
3 . . . source electrode
4 . . . second gate electrode
5 . . . substrate
6 . . . buried oxide film layer
7 . . . trench isolation layer
8 . . . first-gate oxide film
MD1, MD2 . . . transistor in drive circuit
G1, G2, G3 . . . drive circuit control signal
OUT . . . node driven by drive circuit
CL1 . . . load driven by drive circuit
Vss . . . ground potential line
Vdd . . . power supply voltage line
IG1, IG2 . . . gate leakage current flowing through node
Active . . . active state of circuit
Standby . . . standby state of circuit
Ids1, Ids2, Ids3 . . . source-drain current of transistor
Ig1, Ig2 . . . gate leakage current of transistor
STBY, SWEN, STBYN1, STBYN2, STBYP1, STBYP2 . . . control signal for power switch drive circuit
SWON, SWON1, SWON2, SWONN, SWONP . . . power switch control signal
PSW . . . power switch
DRV . . . drive circuit for generating control signal SWON
Vssm . . . ground potential line of circuit block
Vddm . . . power supply voltage line of circuit block Ilogic . . . leakage current flowing through circuit block
Inoise . . . current flowing through power switch
SRAM . . . SRAM circuit block
DSP, CPU . . . module with particular function within SoC
BLOCK, BLOCK1, BLOCK2 . . . circuit block within SoC
SOC . . . SoC chip
ARRAY . . . SRAM memory cell array
DEC . . . address decoder
WDDR . . . word line driver
BLPC . . . bit line precharge circuit
AMP . . . direct peripheral circuit provided for each column
CONT . . . control circuit for controlling SRAM circuit
WL . . . word line
BLT, BLB . . . bit line
MC . . . memory cell
IN1, IN2 . . . word line driver control signal
SWM . . . power switch for memory cell array
MSW, MSR . . . transistor constituting power switch
R1 . . . resistance
D1 . . . diode
MC1 . . . transistor functioning as diode
ARVSS . . . ground potential line for memory cells
ISRAM . . . leakage current of memory cell array
PC . . . bit line precharge circuit
PCE, PCE2 . . . control signal for bit line precharge circuit
IPCE, IPCE2 . . . gate leakage current of transistor within bit line precharge circuit

What is claimed is:

1. A semiconductor memory circuit comprising:
a plurality of memory cells;
a first bit line connected to one storage node of each of the plurality of memory cells,
a second bit line connected to another storage node of each of the plurality of memory cells, the respective another storage nodes having data complementary to that of the respective one storage nodes;
a first double gate transistor connected between the first bit line and a voltage supply line, the first double gate transistor including a first gate having a first gate electrode and a first gate insulating film, and a second gate having a second gate electrode and a second gate insulating film, a thickness of the second gate insulating film being larger than a thickness of the first gate insulating film, and
a second double gate transistor connected between the second bit line and the voltage supply line, the second double gate transistor including a third gate having a third gate electrode and a third gate insulating film, and a fourth gate having a fourth gate electrode and a fourth gate insulating film, a thickness of the fourth gate insulating film being larger than a thickness of the third gate insulating film,
wherein the first gate electrode is connected to the third gate electrode and the second gate electrode is connected to the fourth gate electrode,
wherein the semiconductor memory circuit is constructed such that:
the voltage supply line is supplied with a first potential;
in a first period, a common potential is simultaneously supplied to the first to fourth gate electrodes; and
in a second period, the first potential is commonly supplied to the first and third gate electrodes, and a second potential being different from the first potential is commonly supplied to the second and fourth gate electrodes.

2. The semiconductor memory circuit according to claim 1, wherein the semiconductor memory circuit is SRAM.

3. The semiconductor memory circuit according to claim 1, wherein the semiconductor memory circuit is constructed such that a gate leakage current flowing in the second period is less than a gate leakage current flowing in the first period.

* * * * *